(12) United States Patent
Jeong et al.

(10) Patent No.: US 7,713,798 B2
(45) Date of Patent: May 11, 2010

(54) THIN FILM TRANSISTOR SUBSTRATE HAVING NICKEL-SILICIDE LAYER

(75) Inventors: Chang-Oh Jeong, Suwon-si (KR); Beom-Seok Cho, Seoul (KR); Hee-Hwan Choe, Incheon-si (KR)

(73) Assignee: Samsung Electronics Co., Ltd., Suwon-Si, Gyeonggi-Do (KR)

( * ) Notice: Subject to any disclaimer, the term of this patent is extended or adjusted under 35 U.S.C. 154(b) by 0 days.

(21) Appl. No.: 12/338,671

(22) Filed: Dec. 18, 2008

(65) Prior Publication Data

US 2009/0212298 A1  Aug. 27, 2009

Related U.S. Application Data

(63) Continuation of application No. 10/548,562, filed as application No. PCT/KR2004/000439 on Feb. 28, 2004, now Pat. No. 7,485,927.

(30) Foreign Application Priority Data

Mar. 12, 2003  (KR)  ............... 2003-15522

(51) Int. Cl.
*H01L 21/00* (2006.01)
(52) U.S. Cl. .............. 438/149; 438/685; 257/347; 257/E21.415; 257/E21.593; 257/E27.111; 257/E29.151
(58) Field of Classification Search .......... 438/149, 438/347, 685; 257/E21.415, E27.111, E29.151
See application file for complete search history.

(56) References Cited

U.S. PATENT DOCUMENTS

| 5,942,767 | A  | * | 8/1999 | Na et al. ................... 257/59 |
| 6,285,041 | B1 | * | 9/2001 | Noguchi .................... 257/61 |
| 6,885,064 | B2 | * | 4/2005 | You ........................... 257/347 |
| 2002/0093016 | A1 | * | 7/2002 | Lim et al. ................. 257/59 |

FOREIGN PATENT DOCUMENTS

| JP | 2002-217129 | 8/2002 |
| KR | 100000072230 | 12/2000 |
| KR | 1020010054687 | 7/2001 |

OTHER PUBLICATIONS

English Abstract for Publication No. 1020000072230.
English Abstract for Publication No. 1020010054687.
English Abstract for Publication No. 2002-217129.

* cited by examiner

*Primary Examiner*—Charles D Garber
*Assistant Examiner*—Stanetta D Isaac
(74) *Attorney, Agent, or Firm*—F. Chau & Associates, LLC

(57) ABSTRACT

Disclosed are a thin film transistor substrate of an LCD device and a method of manufacturing the same. The thin film transistor substrate includes a nickel-silicide layer formed on an insulating layer pattern including silicon and a metal layer formed on the nickel-silicide layer. Nickel is coated on the insulating layer pattern including silicon and a metal material is coated on the nickel-coated layer. After that, a heat treatment is performed at about 200 to about 350° C. to obtain the nickel-silicide layer. Since the thin film transistor substrate of the LCD device is manufactured by applying the nickel-silicide wiring, a device having low resistivity and good ohmic contact property can be obtained.

14 Claims, 37 Drawing Sheets

[Fig. 1]
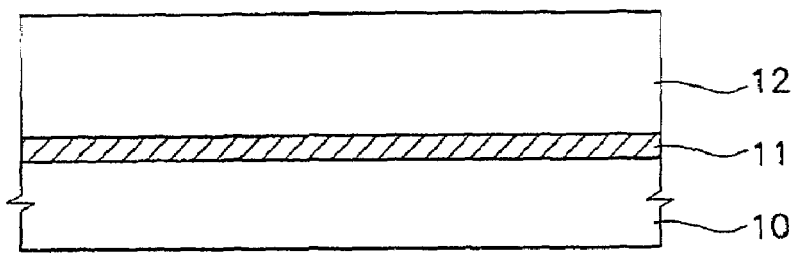
[Fig. 2]
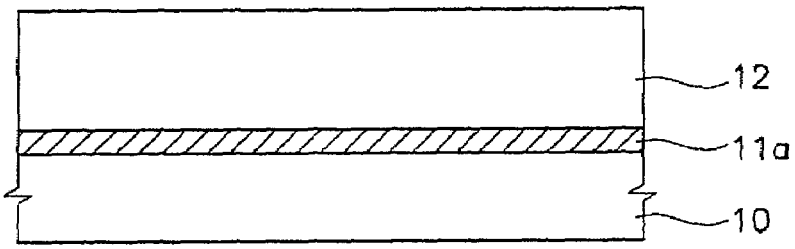
[Fig. 3]
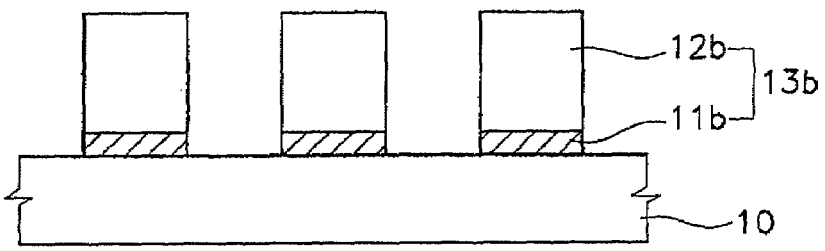
[Fig. 4]
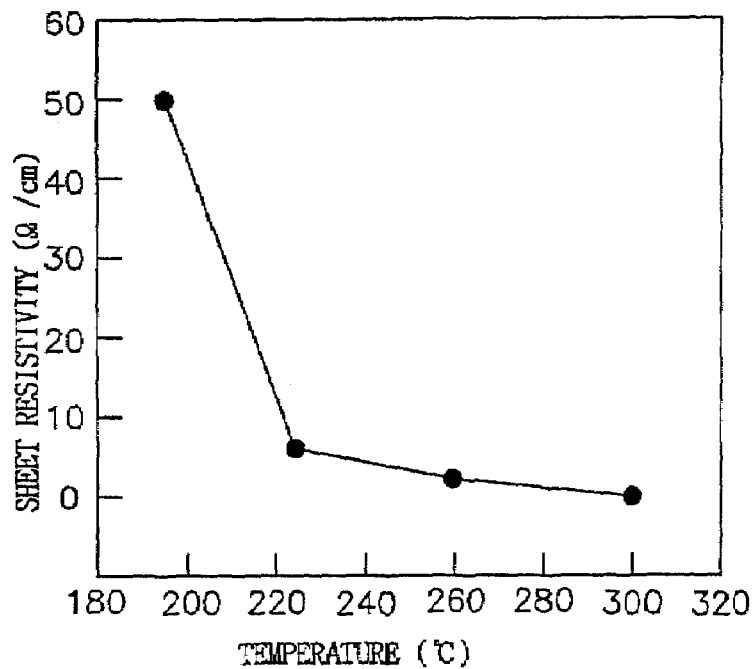

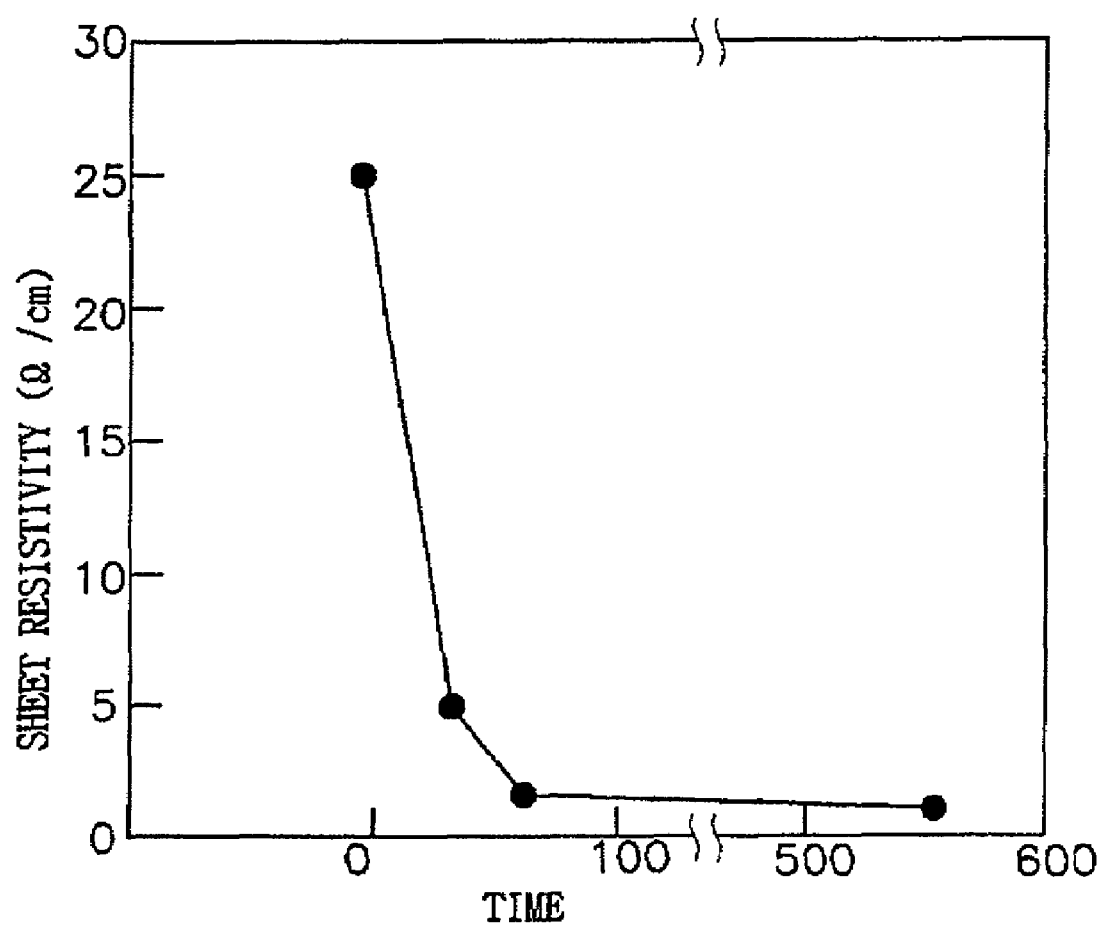
[Fig. 5]

THIN FILM TRANSISTOR SUBSTRATE HAVING NICKEL-SILICIDE LAYER

CROSS-REFERENCE TO RELATED APPLICATION

The present application is a continuation of co-pending U.S. patent application Ser. No. 10/548,562, filed Sep. 9, 2005 now U.S. Pat. No. 7,485,927, which is a National Stage filing under 35 U.S.C. §371 of International Patent Application PCT/KR04/00439, filed Feb. 28, 2004, which claims priority to Korean Patent Application No. 10-2003-0015522, filed Mar. 12, 2003, the entire contents of which are herein incorporated by reference.

BACKGROUND OF THE INVENTION

1. Technical Field

The present disclosure relates to a thin film transistor substrate and, more specifically, to a thin film transistor substrate having a nickel-silicide layer.

2. Discussion of Related Art

In general, display devices are electric and optical devices, which are used to transform electric signals into visual images so that a user can directly recognize information. Among the display devices, an LCD device is a display device utilizing optical characteristics of a liquid crystal. That is, the LCD device displays an image according as the arrangement of liquid crystal molecules is changed by applying electric field thereto.

When thin film transistors are employed for large-sized display devices, the gate resistance of the transistor should be small so as to prevent a delay of signals or a flickering of an image. As a metal having small resistance and large conductivity, copper (Cu) and aluminum (Al) can be exemplified. However, these metals are restricted in processing. In particular, copper has the lowest resistivity among various metals and so a development on processing utilizing copper attracts much concern.

However, when copper is used for the processing, an adhesive strength thereof onto a substrate or onto an insulation layer is low and copper is liable to form a native oxide film thereon. In addition, when a copper wiring is employed for manufacturing a thin film transistor substrate, the diffusion of copper into a silicon (Si) substrate should be prevented and an adhesive strength onto the substrate also should be confirmed.

Accordingly, the development of a wiring material giving improved characteristics of a transistor and a good ohmic contact property of a device is continuously required.

SUMMARY

Considering the above-described problems, it is one feature of the present invention to provide a thin film transistor substrate of an LCD device having improved device characteristics and good transistor characteristics by applying a wiring material having a good ohmic contact property.

It is another feature of the present invention to provide a method of manufacturing a thin film transistor substrate of an LCD device including the above-mentioned wiring material.

In accordance with one aspect of the present invention, there is provided a thin film transistor substrate for a display device including a nickel-silicide layer formed on an insulating layer pattern having silicon and a metal layer formed on the nickel-silicide layer. In particular, the nickel-silicide layer preferably has a thickness in a range of about 10 to about 500 Å, and the metal layer is formed using at least one selected from the group consisting of chromium (Cr), molybdenum (Mo), molybdenum-tungsten (Mo—W), tantalum (Ta) and titanium (Ti). In addition, the nickel-silicide layer preferably has sheet resistance of about 50 Ω/cm or less, and the N-silicide layer and the metal layer are used as one of a gate wiring and a data wiring. Further, the nickel-silicide layer preferably includes $NSi_2$ as a main ingredient.

In accordance another aspect of the present invention, there is provided a method of manufacturing a thin film transistor substrate for a display device. According to the method, after forming a gate wiring on a substrate, the gate wiring is etched to form a gate pattern including a gate line, a gate pad and a gate electrode. Then, a semi-conductor layer pattern and an ohmic contact layer pattern are formed on a gate insulating layer after forming the gate insulating layer on the gate pattern. Nickel is coated as a first data wiring material and a second data wiring material is coated thereon, and then patterning, to form a data wiring including a data line crossing the gate line, a data pad connected to the data line, a source electrode adjacent to the gate electrode and connected to the data line and a drain electrode fading the source electrode with centering the gate electrode. After forming a passivation layer, the gate insulating layer and the passivation layer are patterned to form contact holes exposing the gate pad, the data pad and the drain electrode. A transparent and conductive layer is formed, and then the transparent and conductive layer is etched to form an auxiliary gate pad, an auxiliary data pad and a pixel electrode, respectively, connected to the gate pad, the data pad and the drain electrode. Here, the first data wiring material is preferably coated to a thickness of about 50 to about 300 Å and the second data wiring material includes preferably selected one from the group consisting of Cr, Mo, Mo—W, Ta and Ti. In addition, a heat treating process is preferably implemented after coating the first and the second data wiring material at about 200 to about 350° C. under vacuum, an air atmosphere or $N_2$ gas atmosphere. Alternately, the heat treating can be accomplished by heat applied during a subsequent forming step of a passivation layer.

In accordance with still another aspect of the present invention, in a method of manufacturing a thin film transistor substrate for a display device, a gate wiring is formed on a substrate, and then the gate wiring is etched to form a gate pattern including a gate line, a gate pad and a gate electrode. After forming a gate insulating layer, a semiconductor layer, an ohmic contact layer and a conductive layer are formed. There is formed a photoresist pattern including a first portion, a second portion thicker than the first portion and a third portion thinner than the first portion. Using photoresist pattern, there is formed a first data line including N as a first wiring material, a second data line including a second wiring material, a data pad connected to the data line, and a data wiring including a source electrode and a drain electrode, and to form an ohmic contact layer and a semiconductor layer pattern. After forming a passivation layer, the gate insulating layer and the passivation layer are patterned to form contact holes for respectively exposing the gate pad, the data pad and the drain electrode. A transparent and conductive layer is formed, and then the transparent and conductive layer is etched to form an auxiliary gate pad, an auxiliary data pad and a pixel electrode, respectively connected to the gate pad, the data pad and the drain electrode. In particular, the first portion is formed between the source electrode and the drain electrode, and the second portion is formed on the data wiring.

In accordance with still another aspect of the present invention, there is provided a method of manufacturing a thin film transistor substrate for a display device. In the method of manufacturing a thin film transistor substrate for a display device, after forming a data wiring including a first data line including N as a first wiring material and a second data line on an insulating substrate, a red, a green and a blue color filters are formed on the substrate. A buffering layer is formed by depositing a buffering material to cover the data wiring and the color filter. After forming a gate wiring layer on the buffering layer, the gate wiring layer is patterned to form a gate wiring including a gate line and a gate electrode. A gate insulating layer is formed for covering the gate wiring. An ohmic contact layer and a semiconductor layer pattern having an island shape are formed on the gate insulating layer, and then a first contact hole is formed at the gate insulating layer and the buffering layer for exposing a portion of the data line. After coating a transparent and conductive material on the ohmic contact layer pattern having the island shape and then etching to form a source electrode and a drain electrode, the source electrode and the drain electrode being separately formed as the same layer, and to form a pixel wiring including a pixel electrode connected to the drain electrode, an exposed portion of the ohmic contact layer pattern positioned between the source electrode and the drain electrode is removed to separate the ohmic contact layer pattern.

The display device includes a liquid crystal display (LCD), an optical device, a semiconductor display device, etc.

According to the present invention, since the thin film transistor substrate of the display device is manufactured by applying the nickel-silicide wiring, a device having low resistivity and good ohmic contact property can be obtained.

BRIEF DESCRIPTION OF THE DRAWINGS

A more complete appreciation of the present disclosure and many of the attendant aspects thereof will be readily obtained as the same becomes better understood by reference to the following detailed description when considered in connection with the accompanying drawings, wherein:

FIGS. 1 to 3 are cross-sectional views for illustrating a method of forming a nickel-silicide wiring on a thin film transistor substrate of a liquid crystal display device according to an embodiment of the present invention;

FIGS. 4 and 5 are graphs for illustrating sheet resistivity of a nickel-silicide layer in accordance with heat treatment;

DETAILED DESCRIPTION OF THE DRAWINGS

Figure 6:
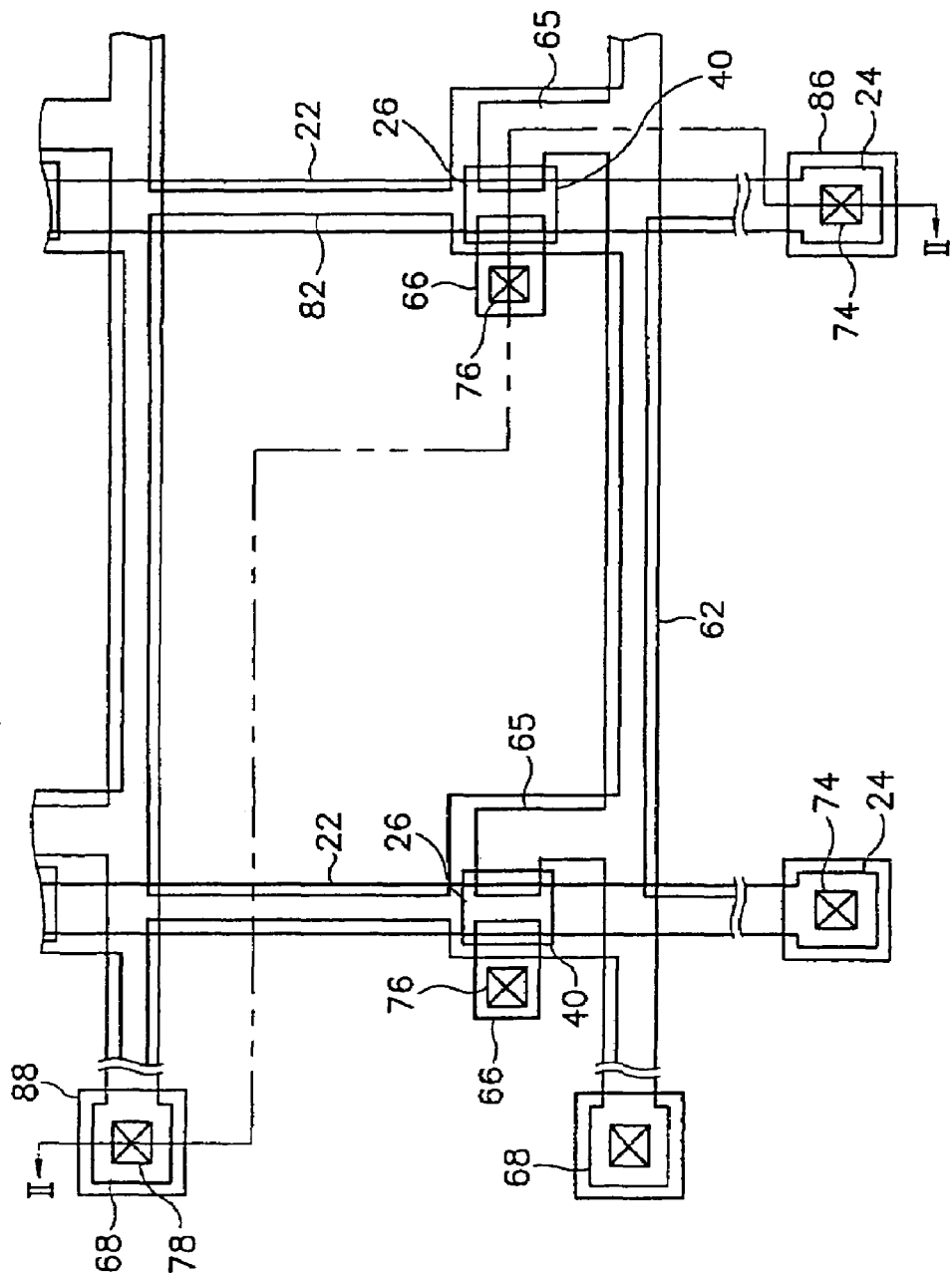
FIG. 6 is a schematic perspective view of a thin film transistor substrate of a liquid crystal display device according to an embodiment of the present invention.

In describing exemplary embodiments of the present disclosure illustrated in the drawings, specific terminology is employed for sake of clarity. However, the present disclosure is not intended to be limited to the specific terminology so selected, and it is to be understood that each specific element includes all technical equivalents which operate in a similar manner.

Salicidation (self-aligned silicide) process may be employed for selectively forming a silicide layer in a predetermined region. According to the salicidation process, metal material such as titanium (Ti), cobalt (Co), nickel (N) and the like is deposited, and then thermally treated to form titanium-silicide layer, cobalt-silicide layer, nickel-silicide layer and the like when silicon exists in an underlying layer. After that, metal is deposited to form a metal layer. Then, this metal layer can advantageously contact the underlying layer including silicon through the silicide layer.

Among these metals, nickel and silicon may react to produce a nickel-silicide layer. The sheet resistivity of the nickel-silicide layer is about 50 Ω/cm or less. Therefore, when the nickel-silicide is used to form a wiring of a transistor substrate, good ohmic contact property may be expected. In order to form a silicide layer, a nickel single layer is formed on an insulation layer including silicon, and then the nickel single layer is thermally treated. Because nickel itself has very good contact property, the nickel single layer may be a metal layer for a gate electrode or source/drain electrodes. However, since nickel is ferromagnetic material, the formation of the nickel layer by a sputtering process may not be easily performed.

When the nickel layer is formed using a sputtering apparatus, the thickness of a sputtering target should be about 3 mmt (3 mm thickness) or less. When a thicker nickel layer is required, an apparatus including a magnet having strong magnetic force should be prepared. However, the control of the uniformity of a formed layer may be not easy as the thickness of the layer increases. In addition, when the thickness of the layer increases, the intensity of the magnetic field of the apparatus should be decreased since nickel is ferromagnetic material, thereby lowering producing efficiency.

Considering the above-mentioned matters, the following method can be a solution. That is, nickel is deposited to have a sufficiently thin thickness of about 10 to about 500 Å, and then a second metal material having good contact property with nickel is deposited on thus formed a nickel layer to form a metal double layer. After that, a subsequent thermally treating process is implemented to transform nickel into nickel-silicide.

When the thickness of the nickel layer is thinner than about 10 Å, the improvement of an ohmic contact property of a device may be too little. When the thickness of the nickel layer is thicker than about 500 Å, producing efficiency decreases. Therefore, the nickel layer preferably has a thickness in the range of about 10 to about 500 Å.

Any metal can be used without exception for forming the second metal layer on the nickel layer. When considering an adhesiveness with nickel, resistivity, etc, metal including Cr, Mo, Mo—W, Ta, Ti and the like can be preferably used.

Hereinafter, a thin film transistor substrate including a wiring structure of a low resistivity and a method of manufacturing the same according to the present invention will be described in detail with reference to the accompanying drawings.

FIGS. 1 to 3 are cross-sectional views illustrating a method of forming a nickel-silicide wiring on a thin film transistor substrate of an LCD device according to one embodiment of the present invention.

Referring to FIG. 1, after a nickel layer 11 is formed on a substrate 10 including silicon to have a thickness of about 10 to about 500 Å, a second metal layer 12 is formed on the nickel layer 11.

Referring to FIG. 2, the nickel layer 11 is transformed into a nickel-silicide compound layer 11a by an additional heat treatment process or by heat applied during a subsequent process.

Referring to FIG. 3, a wiring pattern 13b including a nickel-silicide layer pattern 11b and a second metal layer pattern 12b, are formed on the substrate 10 by an etching process under predetermined etching conditions.

Advantageous conditions of the heat treatment process to transform the nickel layer 11 into the nickel-silicide layer 11a will be examined below.

FIGS. 4 and 5 are graphs for illustrating a sheet resistivity of a nickel-silicide layer according to conditions of a heat treatment process. FIG. 4 illustrates a sheet resistivity of the nickel-silicide layer relative to thermally treating temperature, and FIG. 5 illustrates a sheet resistivity of the nickel-silicide layer relative to thermally treating time.

As shown in FIG. 4, the sheet resistivity of the nickel-silicide layer is illustrated relative to the thermally treating temperature of about 200° C. to about 300° C. when the thermally treating time is about 1 hour. In the graph, the sheet resistivity of the nickel-silicide layer is about 50 $\Omega$/cm when the heat treatment process is performed at a temperature of about 200° C. for 1 hour. The sheet resistivity decreases according to the increase of the thermally treating temperature and the sheet resistivity of the nickel-silicide layer is about 10 $\Omega$/cm or less when the heat treatment process is performed at a temperature of about 220° C. for about 1 hour.

Referring to FIG. 5, the sheet resistivity of the nickel-silicide layer is illustrated relative to the thermally treating time of about 0 to about 550 minutes when the thermally treating temperature is fixed to about 260° C. In the graph, the sheet resistivity largely decreases according to the increase of the thermally treating time at the beginning, and then keeps a constant value at the later time.

The thermally treating temperature and the thermally treating time illustrate complementary property to each other. That is, when the thermally treating temperature is lowered, the thermally treating time becomes longer, and when the thermally treating temperature is heightened, the thermally treating time becomes shorter. Any appropriate condition can be applied considering various circumstances. The desired effect can be accomplished only if the sheet resistivity of thus formed the nickel-silicide layer is about 50 $\Omega$/cm or less. When considering thus obtained result, preferred conditions of the heat treatment process includes a temperature of about 200 to about 350° C. with a time range of about 20 to about 100 minutes.

An atmosphere during the heat treatment process is not limited, however, any atmosphere is applicable without exception including an air, vacuum or a nitrogen ($N_2$) gas atmosphere. In addition, the heat treatment process can be separately performed after forming the nickel layer or can be omitted for the sake of the time and the producing efficiency. The heat treatment process can be implemented during a subsequent process such as a step of forming a passivation layer. However, when the heat treatment process is carried out separately, stable processing conditions can be confirmed. In addition, the subsequent processes can proceed under stable conditions when the heat treatment process is carried out after forming the nickel-silicide layer.

After completing the heat treatment process according to the above-mentioned various conditions, nickel and silicon contained in an underlying layer combine to form nickel-silicide. Here, nickel-silicide includes $NS_1$, $N_2Si$, $NSi_2$, etc. Nickel-silicide advantageously includes $NSi_2$ as a main component.

Hereinafter, the structure of the thin film transistor substrate of the LCD device according to one embodiment of the present invention will be described in detail with reference to FIGS. 6 and 7.

Figure 7:
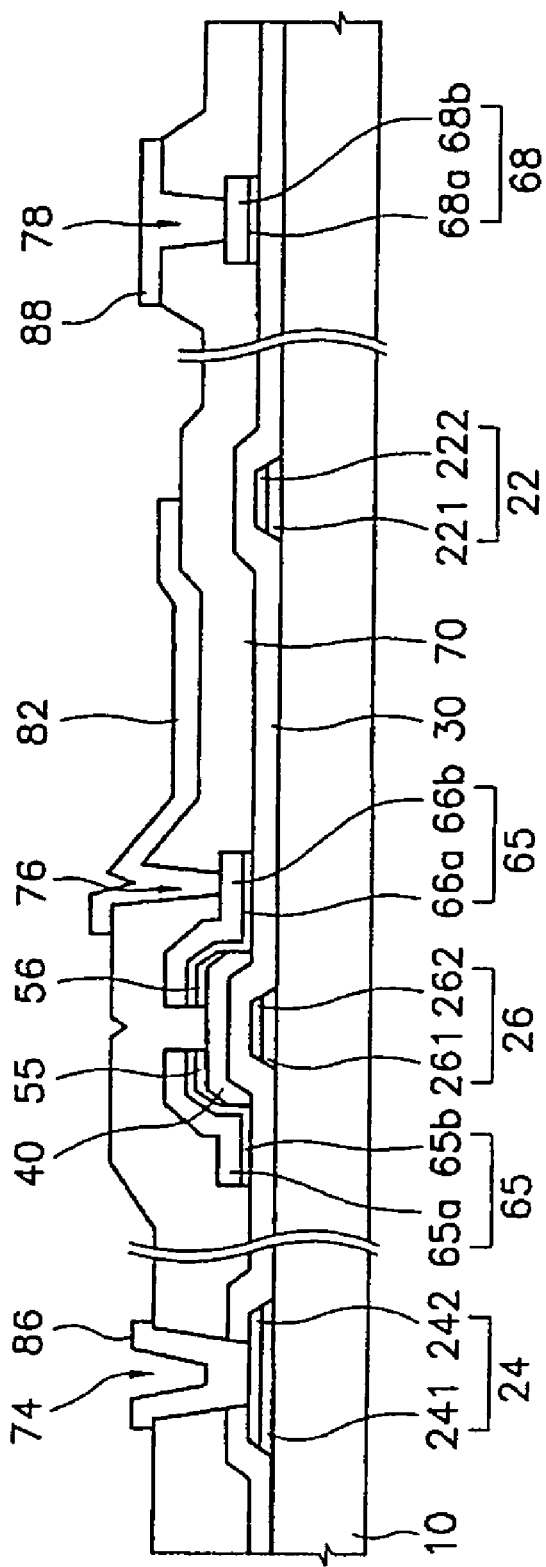
FIG. 7 is a cross-sectional view taken along the line of 11-11 in FIG. 6.

FIG. 6 is a schematic perspective view illustrating a thin film transistor substrate of an LCD device according to one embodiment of the present invention, and FIG. 7 is a cross-sectional view taken along the line of II-II in FIG. 6.

On an insulating substrate 10, a gate wiring including first gate wiring layers 221, 241 and 261, and second gate wiring layers 222, 242 and 262, is formed. The first gate wiring layers 221, 241 and 261 are formed using chrome, aluminum-neodymium (Al—Mo) complex, or the like, and second gate wiring layers 222, 242 and 262 are formed using aluminum-neodymium complex, molybdenum, or the like. The gate wiring includes a gate line 22 extending along a horizontal direction, a gate pad 24 connected to an end portion of the gate line 22 for transferring external gate signals to the gate line 22, and a gate electrode 26 of a thin film transistor connected to the gate line 22.

A gate insulating layer 30 is formed on the substrate 10 to over the gate wirings 22, 24 and 26. The gate insulating layer 30 is formed using silicon nitride ($SiN_x$), or the like.

On the gate insulating layer 30 of the gate electrode 24, a semiconductor layer 40 is formed to have an island shape using semiconductor material such as amorphous silicon. On the semiconductor layer 40, ohmic contact layers 55 and 56 are formed using silicide or n+ hydrogenated amorphous silicon highly doped with n-type impurities.

On the ohmic contact layers 55 and 56 and on the gate insulating layer 30, data wiring layers 62, 65, 66 and 68 including nickel-silicide layers 62a, 65a, 66a and 68a, and second metal layers 62b, 65b, 66b and 68b, are formed. The data wiring layers 62, 65, 66 and 68 include a data line 62, formed along a longitudinal direction and crossed the gate line 22 to define a pixel, a source electrode 65 divided from the data line 62 and extended to an upper portion of the ohmic contact layer 55, a data pad 68 connected to an end portion of the data line 62 and received image signals from exterior, and a drain electrode 66 separately formed from the source electrode 65 and formed on the upper portion of the ohmic contact layer 56 that faces with the ohmic contact layer 55 of the source electrode 65 with respect to the gate electrode 26. On the data wiring layers 62, 65, 66 and 68 and the semiconductor layer 40 that is not covered with the data wiring layers, a passivation layer 70 is formed.

Through the passivation layer 70, contact holes 76 and 78 for exposing the drain electrode 66 and the data pad 68, respectively, are formed, and a contact hole 74 for exposing the gate insulating layer 30 along with the gate pad 24 is formed. Here, the contact holes 74 and 78 for exposing the pads 24 and 68 may be formed into various shapes including a shape having an angle or a circular shape. Preferably, the area of the contact holes 74 and 78 does not exceed about 2 mm×about 6 μm and more preferably, the area of the holes 74 and 78 is about 0.5 mm×about 15 μm or more.

On the passivation layer 70, a pixel electrode 82 is formed. The pixel electrode 82 is electrically connected to the drain electrode 66 through the contact hole 76 and is provided at a pixel position. In addition, on the passivation layer 70, an auxiliary gate pad 86 and an auxiliary data pad 88, respectively connected to the gate pad 24 and the data pad 68, are formed through the contact holes 74 and 78, respectively. Here, the pixel electrode 82 and the auxiliary gate pad and the auxiliary data pad 86 and 88 are formed using indium tin oxide (ITO).

The pixel electrode 82 and the gate line 22 are overlapped to produce a holding storage battery as illustrated in FIGS. 6 and 7. When holding capacity is insufficient, a wiring for the holding capacity can be additionally provided as the same layer with the gate wirings 22, 24 and 26.

The pixel electrode 82 also is overlapped with the data line 62 to maximize aperture efficiency. Even though the pixel electrode 82 and the data line 62 are overlapped to maximize the aperture efficiency, parasitic capacitance formed between them is insignificant because dielectric constant of the passivation layer 70 is low.

Hereinafter, a method of manufacturing a thin film transistor substrate of an LCD device according to an embodiment will be described in detail with reference to accompanying FIGS. 6 and 7 along with FIGS. 8 to 11.

FIGS. 8 to 11 are cross-sectional views illustrating a method of manufacturing a thin film transistor substrate of an LCD device according to an embodiment of the present invention.

Figure 8:
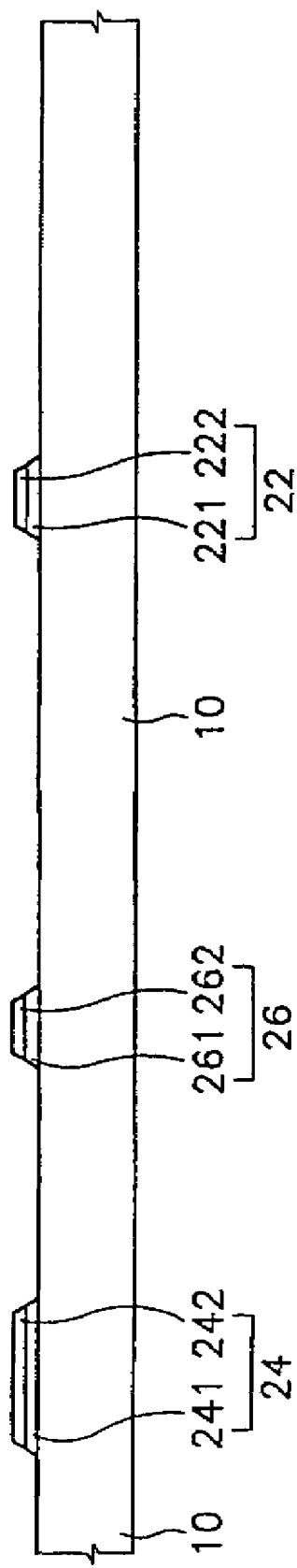
FIGS. 8 to 11 are cross-sectional views illustrating a method of manufacturing a thin film transistor substrate of a liquid crystal display device according to an embodiment of the present invention.

Referring to FIG. 8, the first gate wiring layers 221, 241 and 261 formed using chrome, aluminum-neodymium complex, etc. and the second gate wiring layers 222, 242 and 262 formed using aluminum-neodymium complex, molybdenum, etc. are formed on a substrate 10, and then patterned to form a gate wiring along a horizontal direction. Here, the gate wiring includes a gate line 22, a gate electrode 26 and a gate pad 24.

Figure 9:
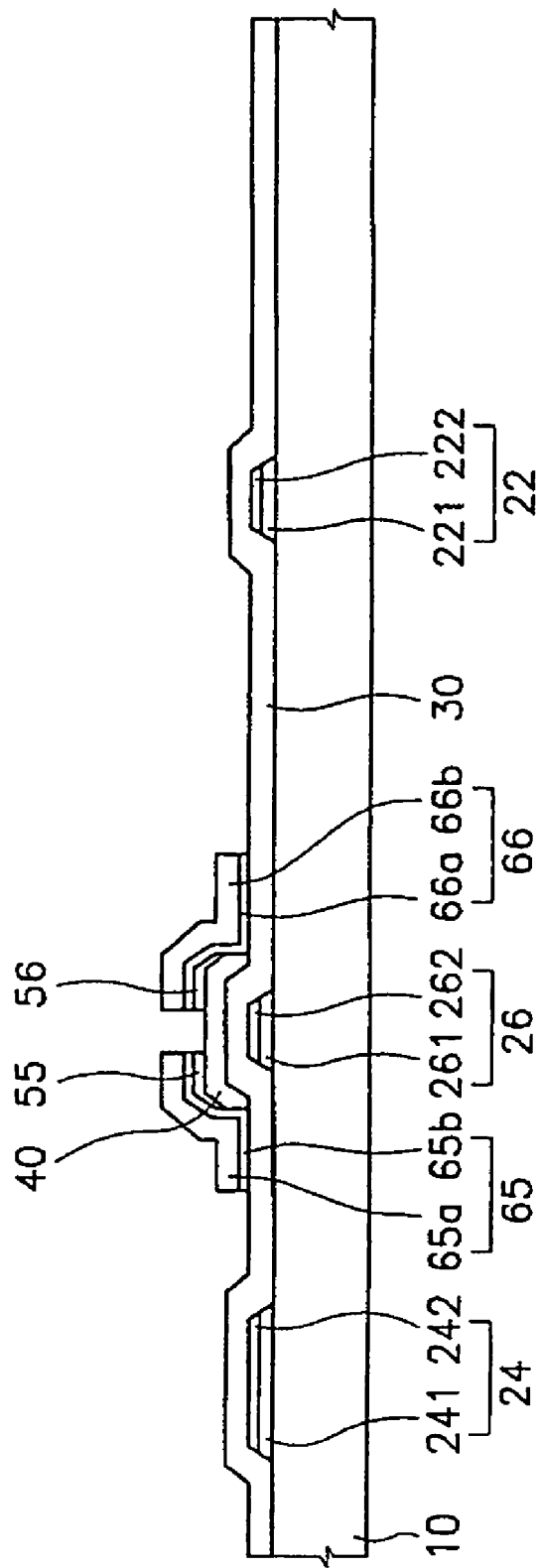

Referring to FIG. 9, a gate insulating layer 30 including silicon nitride, a semi-conductor layer 40 including amorphous silicon and a doped amorphous silicon layer are continuously formed on the gate wiring. The semiconductor layer 40 and the doped amorphous silicon layer are etched using a photolithography process to thereby form a semiconductor layer pattern 40 having an island shape and ohmic contact layers 55 and 56 on the gate insulating layer 30 and above the gate electrode 26.

Figure 10:
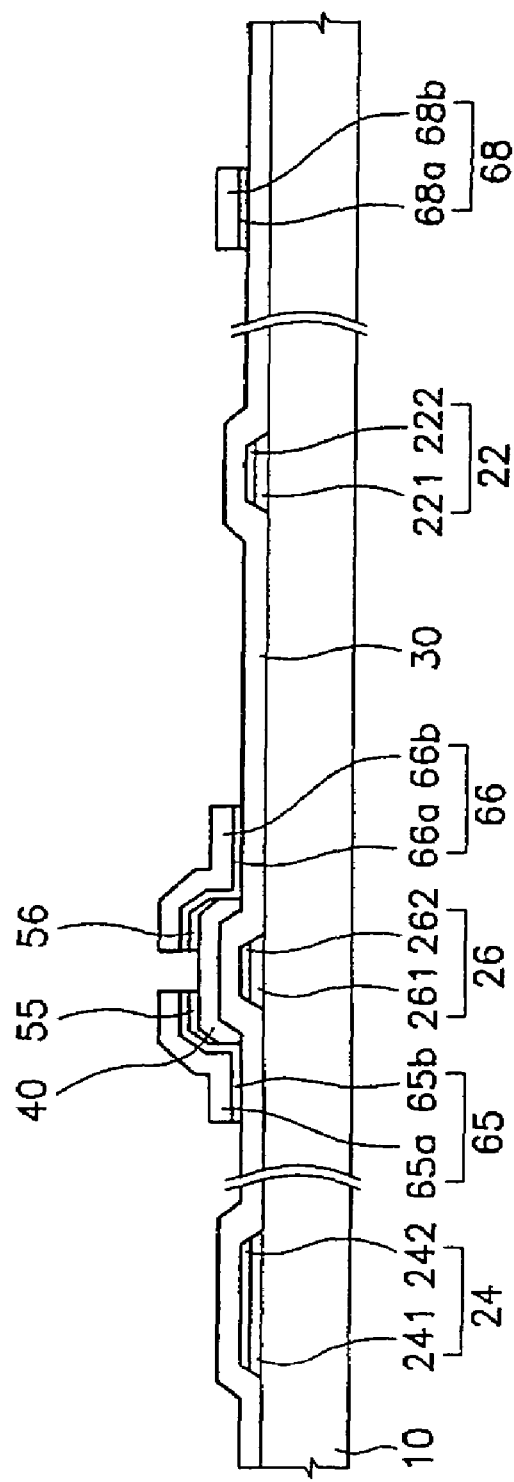

Referring to FIG. 10, at least one alloy of Cr/N, Mo/N, MoW/N, Ta/N and Ti/N is selected, and then deposited on the ohmic contact layers 55 and 56. Preferably, nickel is deposited on the ohmic contact layers 55 and 56 to form nickel layers and then, chromium is deposited to form chromium layers 65b, 66b and 68b to obtain data wiring layers 65, 66 and 68 on the ohmic contact layers 55 and 56 and on the gate insulating layer 30. After that, a heat treatment process is performed on the nickel layers at temperature of about 260° C. for about 1 hour under an air atmosphere to transform the nickel layers into nickel-silicide layers 65a, 66a and 68a.

The metal double layers (that is, the nickel-silicide layers 65a, 66a and 68a and the chromium layers 65b, 66b and 68b) are etched using a photolithography process to form a data wiring that includes a data line 62 crossing the gate line 22, a source electrode 65 connected to the data line 62 and extended to an upper portion of the gate electrode 26, a data pad 68 connected to an end portion of the data line 62, and a drain electrode 66 separated from the source electrode 64 and faced with the source electrode 64 centering the gate electrode 26.

Figure 11:
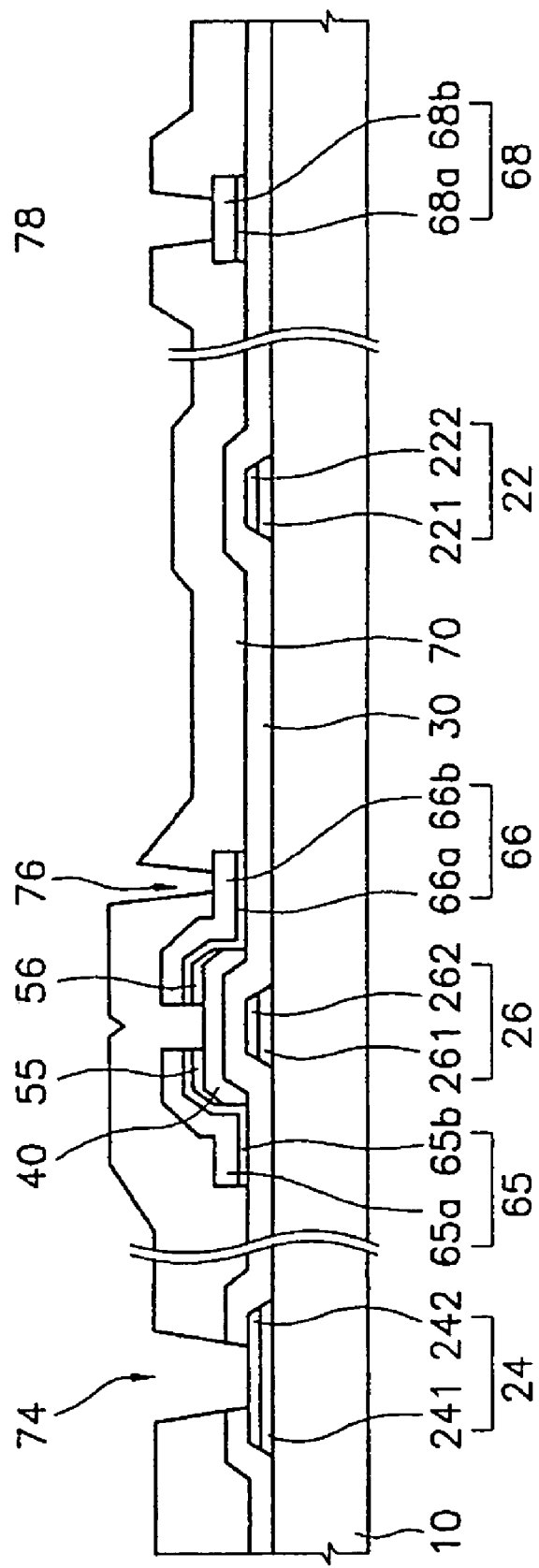

The doped amorphous silicon layer not covered with the data wirings 62, 65, 66 and 68 is etched to separate the doped amorphous silicon layers 55 and 56 centering the gate electrode 26 and to expose the semiconductor layer 40 between the doped amorphous silicon layers 55 and 56. Then, an oxygen plasma treatment process is preferably carried out to stabilize a surface of the exposed semiconductor layer 40. A passivation layer 70 is formed as illustrated in FIG. 11.

Subsequently, the passivation layer 70 is patterned along with the gate insulating layer 30 using a photolithography process to form a first to a third contact holes 74, 76 and 78 that expose the gate pad 24, the drain electrode 66 and the date pad 68, respectively. Here, the first to the third contact holes 74, 76 and 78 can be formed to have various shapes including a shape having an angle and a circular shape. Preferably, the area of the first and second contact holes 74 and 78 to expose the pads 24 and 68 does not exceed about 2 mm×about 60 μm. More preferably, the area the contact holes 74 and 78 is about 0.5 mm×about 15 μm or more.

ITO is deposited on the passivation layer 70 to fill the contact holes 74, 76 and 78, and then etched using a photolithography process to thereby form a pixel electrode 82 is connected to the drain electrode 66 through the first contact hole 76, an auxiliary gate pad 86 and an auxiliary data pad 88 connected to the gate pad 24 and the data pad 68 through the second and third contact holes 74 and 78, respectively, as illustrated in FIGS. 6 and 7. During a pre-heating process before depositing ITO, nitrogen gas is preferably used as an ambient gas in order to prevent the formation of a metal oxide layer on exposed metal layers 24, 66 and 68 through the contact holes 74, 76 and 78.

The method of the present invention may be employed for manufacturing a thin film transistor substrate of an LCD device using five masks. In addition, the method of the present invention also may be applied to manufacture a thin film transistor substrate of an LCD device using four masks. It will be described a method of manufacturing a thin film transistor substrate of an LCD device using four masks with reference to accompanying drawings.

The structure of a unit pixel of a thin film transistor substrate of an LCD device manufactured using four masks according to the present invention will be described with reference to FIGS. 12 to 14.

Figure 12:
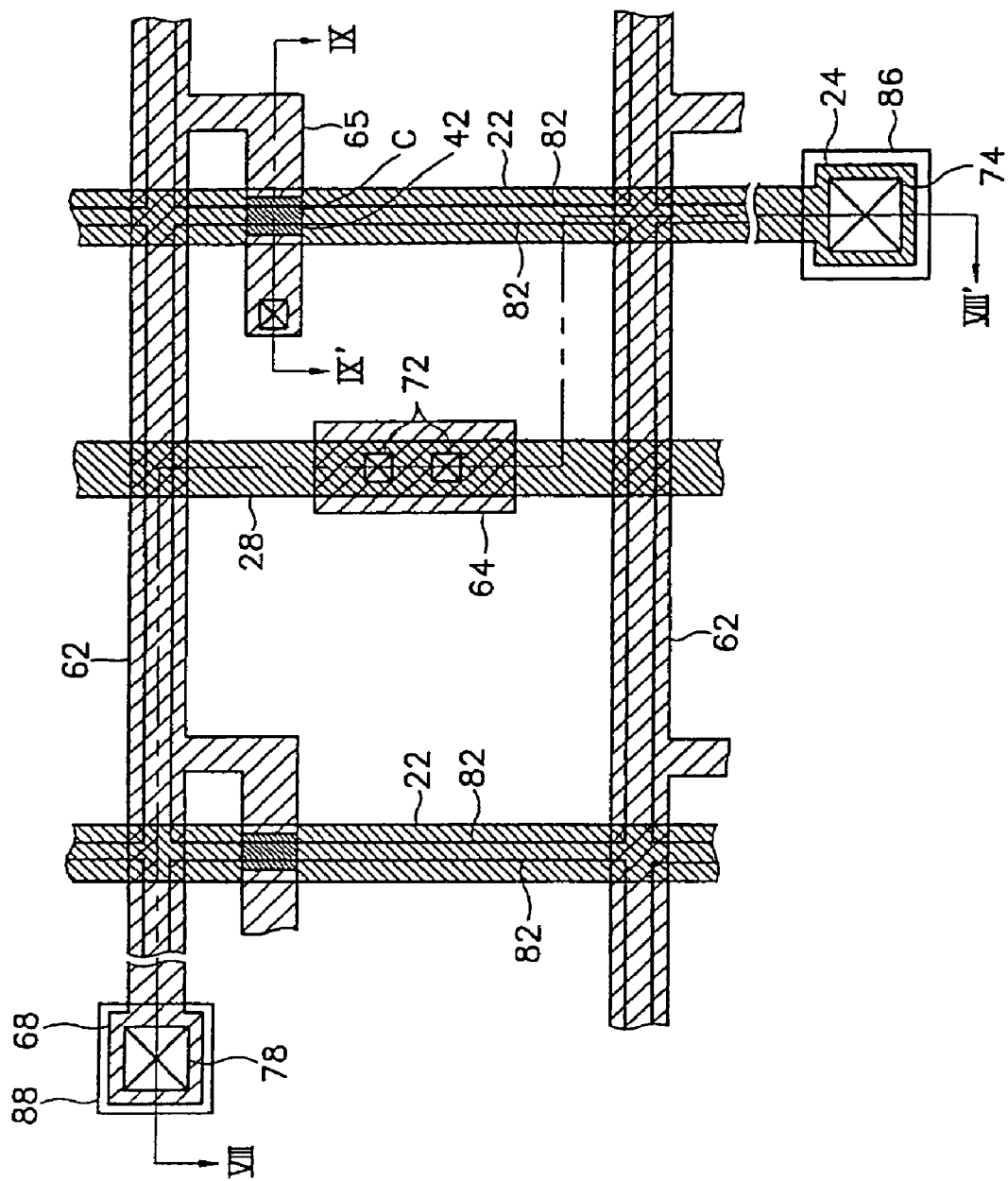
FIG. 12 is a schematic perspective view of a thin film transistor substrate of a liquid crystal display device according to an embodiment of the present invention.
Figure 13:
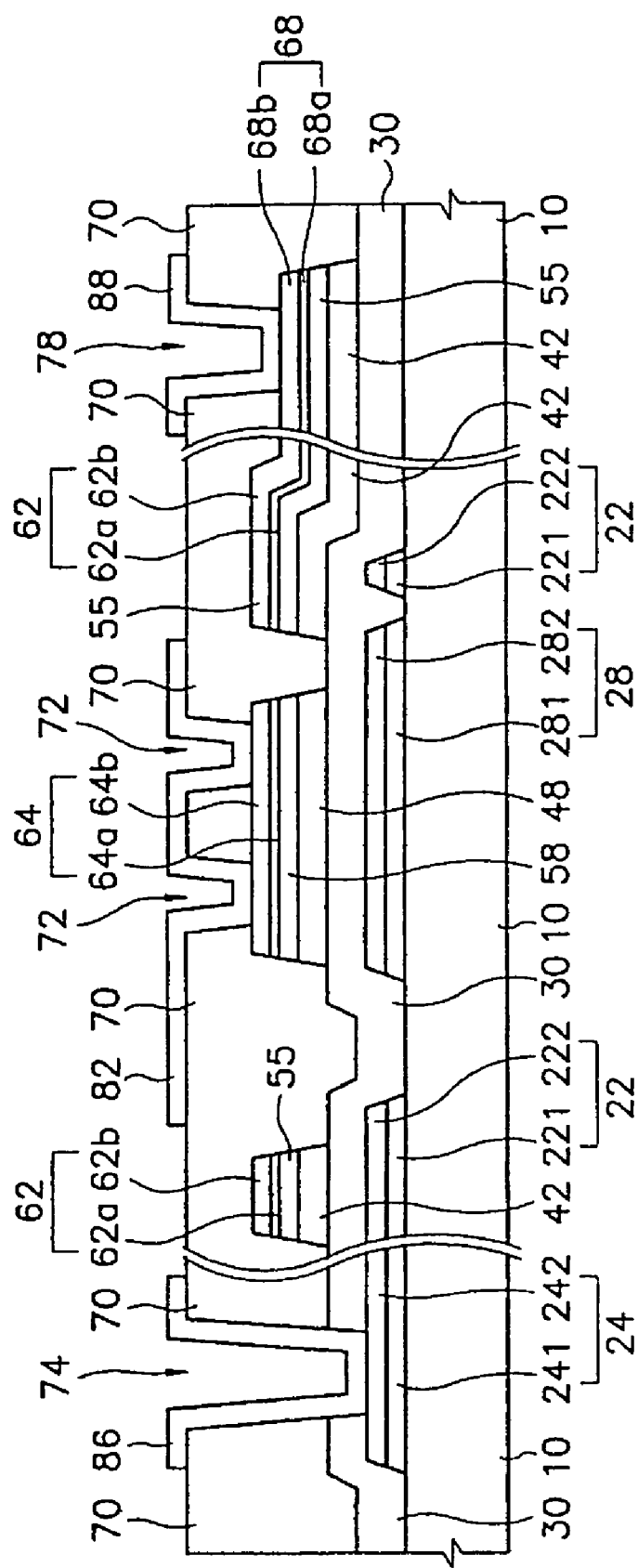
FIGS. 13 and 14 are cross-sectional views taken along the lines of VII-VII' and IX-IX' in FIG. 12, respectively.
Figure 14:
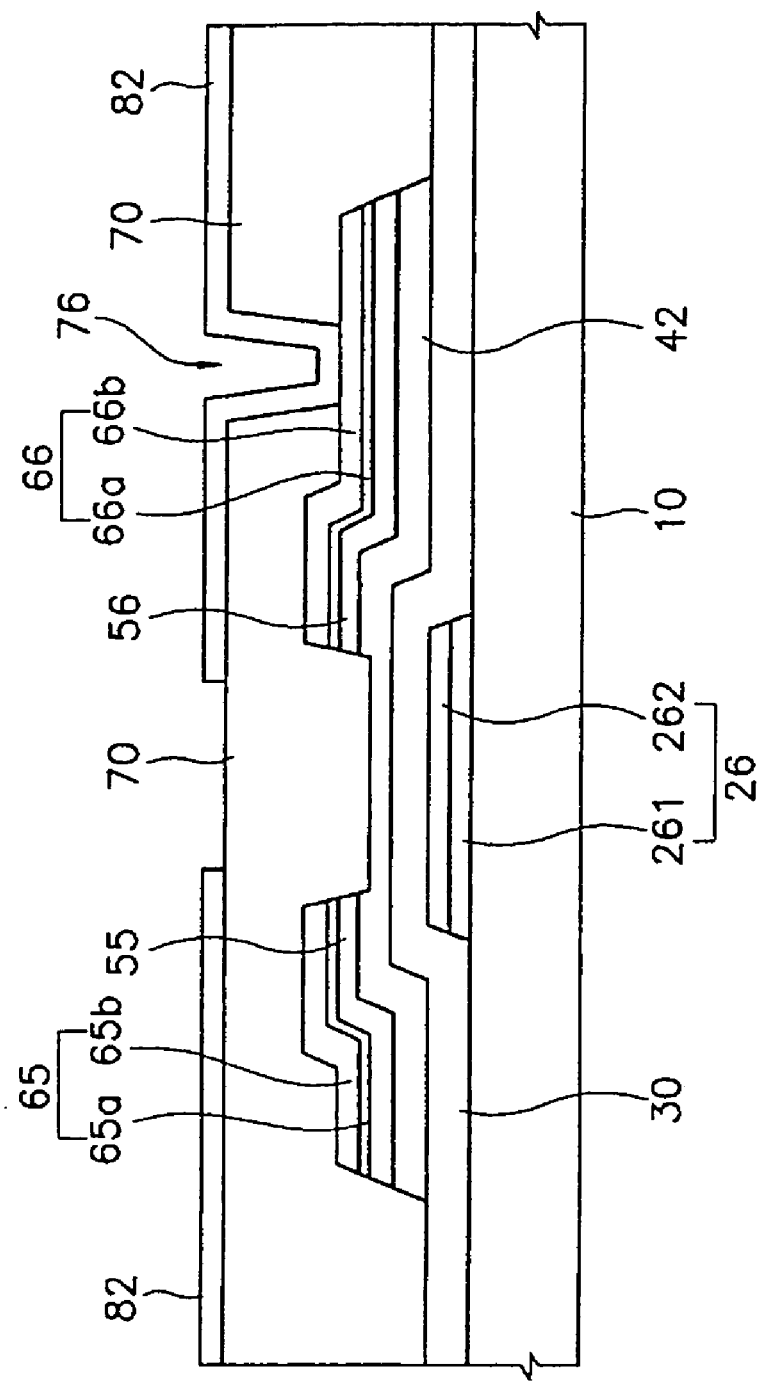

FIG. 12 is a schematic perspective view illustrating a thin film transistor substrate of an LCD device according to an embodiment of the present invention, and FIGS. 13 and 14 are cross-sectional views taken along the lines of VII-VII' and IX-IX' in FIG. 12, respectively.

First, a gate wiring including first gate wiring layers 221, 241 and 261 formed using chrome, aluminum-neodymium complex, etc, and the second gate wiring layers 222, 242 and 262 formed using aluminum-neodymium complex, molybdenum, etc, is formed on an insulting substrate 10, as described in the above-described embodiment. The gate wiring includes a gate line 22, a gate pad 24 and a gate electrode 26.

On the substrate 10, a holding electrode line 28 is formed in parallel with the gate line 22. The holding electrode line 28 also includes the first and the second gate wiring layers 281 and 282. The holding electrode line 28 forms a holding storage capacitor that may be overlapped afterwards with a conductive pattern 68 for a holding storage capacitor connected to a pixel electrode 82, to thereby improve the charge storage capacitance of a pixel.

When holding capacity produced through the overlap of the pixel electrode 82 with the gate line 22 afterwards, is sufficient, the holding electrode line 28 may not be formed. To the holding electrode line 28, generally, the same potential with a common electrode of an upper substrate is applied.

On the gate wirings 22, 24 and 26 and on the holding electrode line 28, a gate insulating layer 30 including silicon nitride ($SiN_x$) and the like, is formed to cover the gate wirings 22, 24, 26 and 28.

On the gate insulating layer 30, semiconductor layer patterns 42 and 48 including semiconductor material such as hydrogenated amorphous silicon, are formed. On the semiconductor layer patterns 42 and 48, ohmic contact layer patterns or intermediate layer patterns 55, 56 and 58 including amorphous silicon highly doped with n-type impurities such as phosphor (P) and the like, are formed.

On the ohmic contact layer patterns 55, 56 and 58, data wiring layers 62, 64, 65, 66 and 68 including nickel-silicide layers 62a, 64a, 65a, 66a and 68a and a second metal material layers 62b, 64b, 65b, 66b and 68b, are formed. The data wiring layers include data line portions 62, 68 and 65. In particular, the data wiring layers include a data line 62 formed along the longitudinal direction, a data pad 68 connected to an end portion of the data line 62 so as to receive external image signals, and a source electrode 65 divided from the data line of a thin film transistor. Further, the data wiring layers include a drain electrode 66 separated from the data line portions 62, 68 and 65 and facing the source electrode 65 centering the gate electrode 26 or a channel portion C of the thin film transistor, and a conductive pattern for the holding storage capacitor 64 provided above the drain electrode 66 of the thin film transistor and the holding electrode line 28. When the holding electrode line 28 may be not formed, the conductive pattern for holding storage capacitor 64 is not formed, either.

The contact layer patterns 55, 56 and 58 reduce the contact resistivity of the semi-conductor layer patterns 42 and 48 positioned thereunder and the data wirings 62, 64, 65, 66 and 68 positioned thereon.

The contact layer patterns 55, 56 and 58 have the same shapes as those of the data wirings 62, 64, 65, 66 and 68. That is, the intermediate layer pattern 55 of the data line portion is substantially identical to the data line portions 62, 68 and 65. The intermediate layer pattern 56 for the drain electrode is substantially identical to the drain electrode 66. The intermediate layer pattern for the holding storage capacitor 58 is also substantially identical to the conductive pattern for the holding storage capacitor 64.

Meantime, the semiconductor layer patterns 42 and 48 have the same shapes as those of the ohmic contact patterns 55, 56 and 58 of the data wirings 62, 64, 65, 66 and 68, except the channel portion C of the thin film transistor. In particular, the semi-conductor layer pattern for the holding storage capacitor 48, the conductive pattern for the holding storage pattern 64 and the contact pattern for the holding storage capacitor 58 have substantially identical shapes. However, the semiconductor layer pattern for the thin film transistor 42 and the remaining portion of the data wirings and the Contact layer patterns are somewhat different. That is, at the channel portion C of the thin film transistor, data line portions 62, 68 and 65, especially the source electrode 65 and the drain electrode 66 are separated, and the intermediate layer pattern 55 of the data line portions and the ohmic contact layer pattern 56 for the drain electrode are separated. However, the semiconductor layer pattern 42 for the thin film transistor is not separated but connected to form the channel of the thin film transistor. On the data wirings 62, 64, 65, 66 and 68, a passivation layer 70 is formed.

The passivation layer 70 includes contact holes 76, 78 and 72 for exposing the drain electrode 66, the data pad 64 and the conductive portion for the holding storage capacitor 68, and a contact hole 74 for exposing the gate insulating layer 30 and the gate pad 24.

On the passivation layer 70, a pixel electrode 82 for receiving image signals from the thin film transistors and generating electric field with an electrode of an upper substrate, is formed. The pixel electrode 82 is generally formed using transparent material such as ITO, and is physically and electrically connected to the drain electrode 66 through the contact hole 76 to receive the image signals.

The pixel electrode 82 is overlapped with the neighboring gate line 22 and the data line 62 to improve aperture efficiency. However, the pixel electrode 82 may not be overlapped with the gate line 22 or the data line 62. The pixel electrode 82 also can be overlapped with the neighboring gate line 22 and data line 62 to improve the aperture efficiency, however, may not be overlapped. The pixel electrode 82 is connected to the conductive pattern for the holding storage capacitor 64 through the contact hole 72 to transmit the image signals to the conductive pattern 64.

Meantime, an auxiliary gate pad 86 and an auxiliary data pad 88 are respectively formed on the gate pad 24 and the data pad 68 through the contact holes 74 and 78. The auxiliary gate pad 86 and the auxiliary data pad 88 support adhesive strength with an external circuit device. Therefore, the provision of the auxiliary gate pad 86 and the auxiliary data pad 88 is not essential, however, is optional.

Hereinafter, a method of manufacturing a thin film transistor substrate of an LCD device having the structure illustrated in FIGS. 12 to 14 utilizing four masks, will be described with reference to FIGS. 12 to 14 and 15 to 30.

Figure 15:
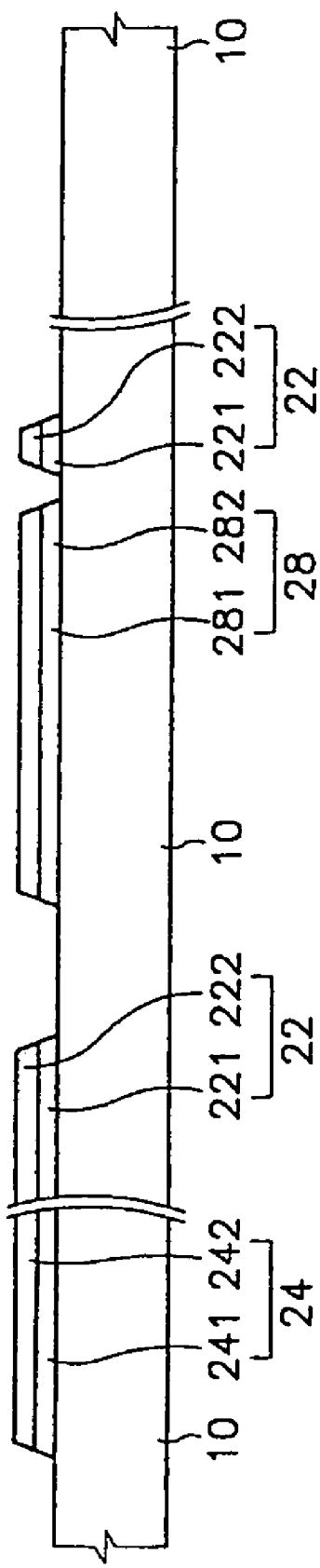
FIGS. 15 to 30 are cross-sectional views illustrating a method of manufacturing a thin film transistor substrate of a liquid crystal display device according to the embodiment of the present invention illustrated in FIGS. 13 and 14.
Figure 16:
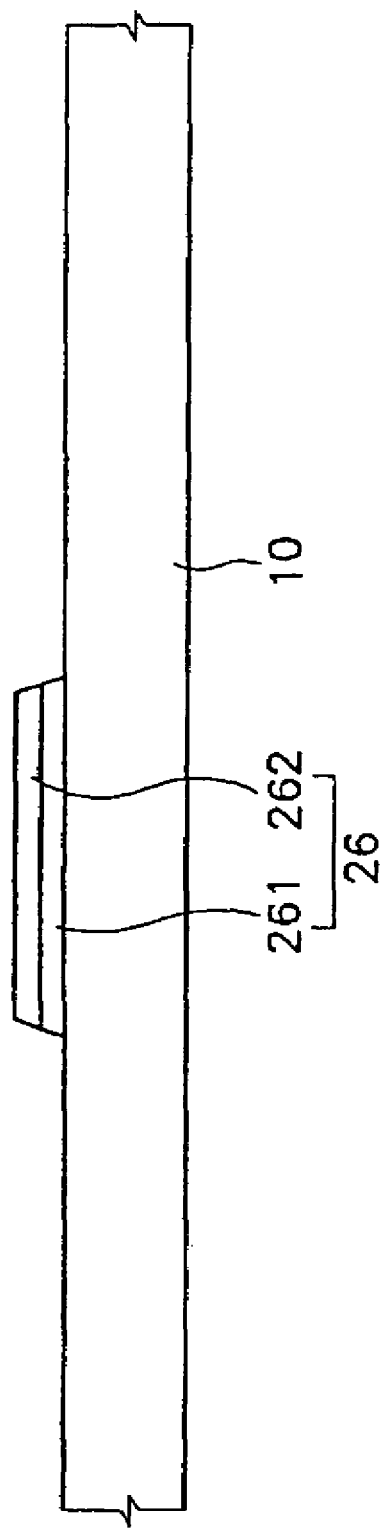

Referring to FIGS. 15 and 16, the first gate wiring layers 221, 241 261 and 281 formed using chrome, aluminum-neodymium complex, etc and the second gate wirings 222, 242, 262 and 282 formed using aluminum-neodymium complex, molybdenum, etc are deposited on a substrate 10, and then etched using a photolithography process according to the above-described embodiment to obtain a gate wiring including a gate line 22, a gate pad 24 and a gate electrode 26 and a holding electrode line 28.

Figure 17:
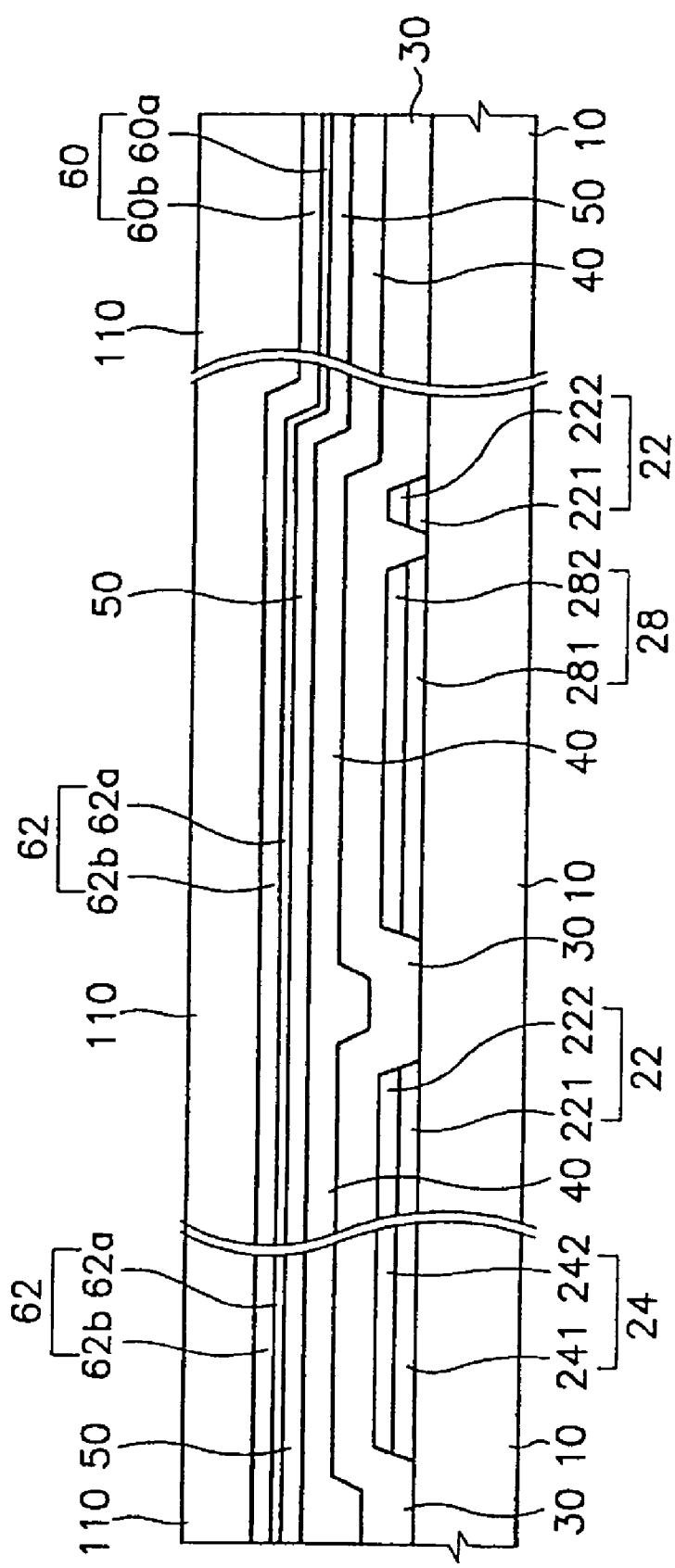
Figure 18:
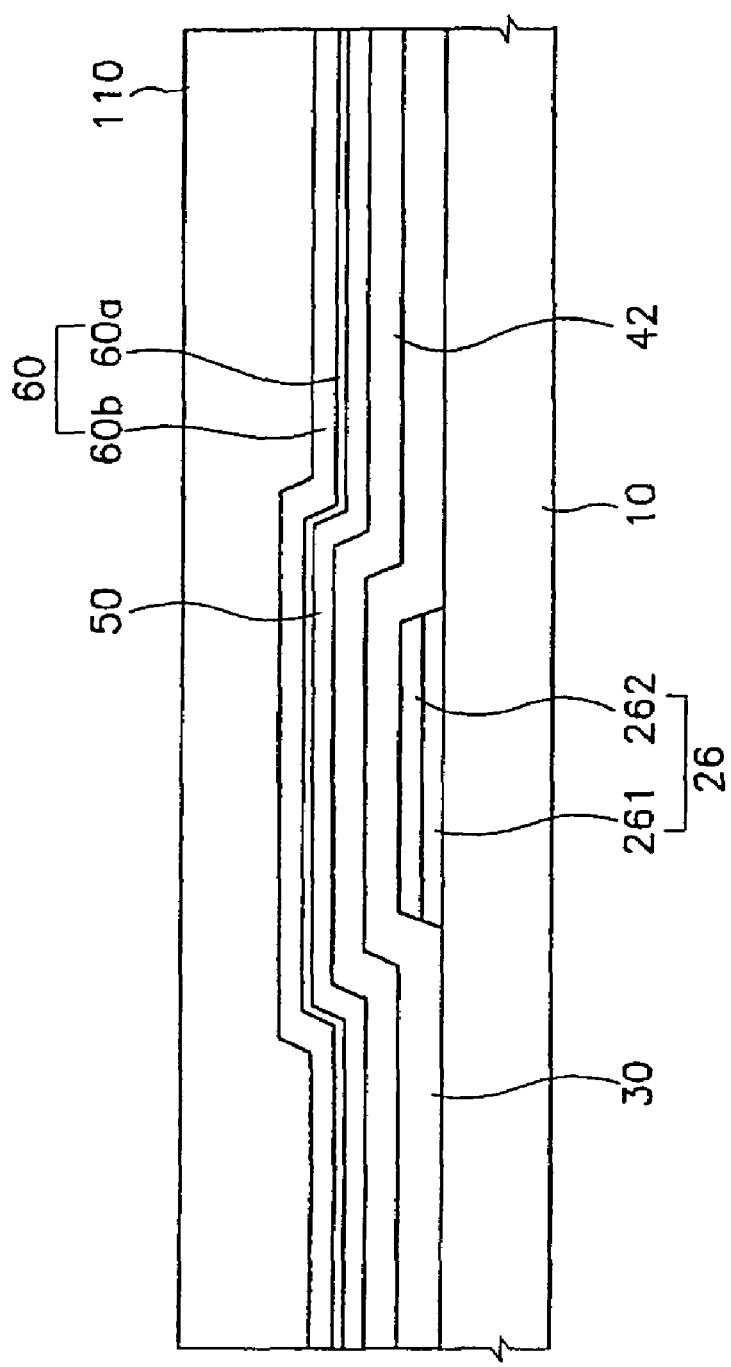

Referring to FIGS. 17 and 18, a gate insulating layer 30 including nitrogen silicide, a semiconductor layer 40 and an intermediate layer 50 are continuously deposited by a chemical vapor deposition (CVD) method to have a thickness of about 1,500 to about 5,000 Å, about 500 to about 2,000 Å and about 300 to about 600 Å, respectively. After that, nickel and chrome are successively deposited by a sputtering process, and heat treated under an air atmosphere at about 260° C. for about 1 hour to form a conductive layer 60 including a nickel-silicide layer 60a and a chrome layer 60b. Then, a photoresist film 110 is formed to have a thickness of about 1 to about 2 μm.

Figure 19:
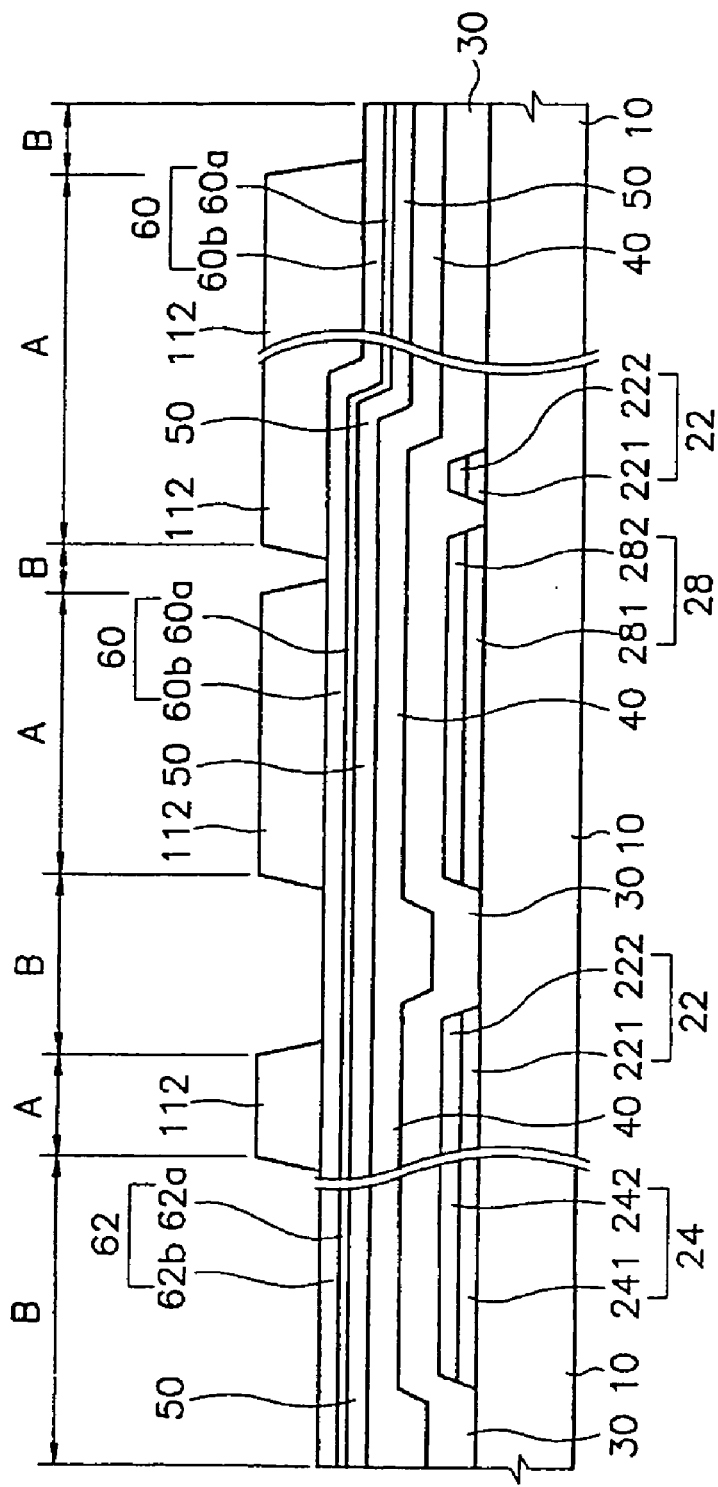
Figure 20:
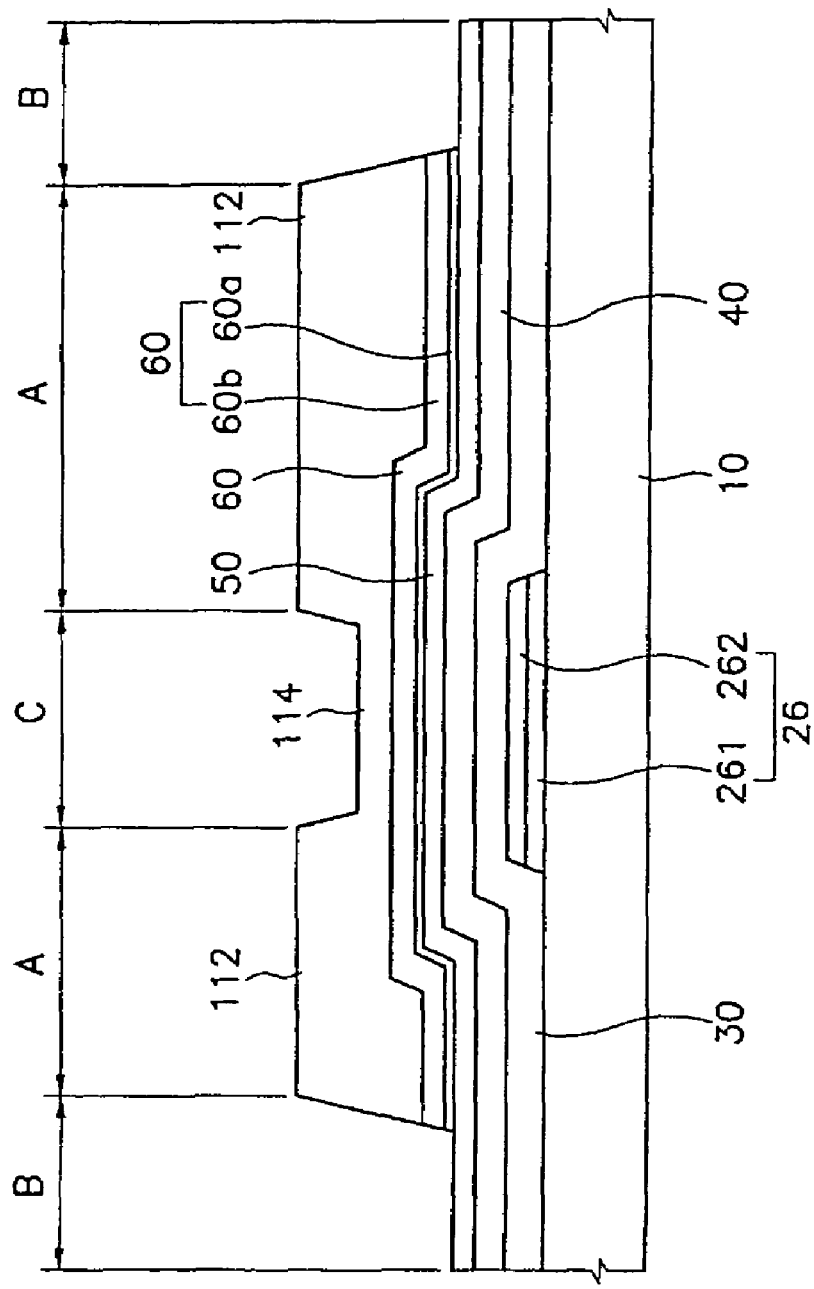

Referring to FIGS. 19 and 20, the photoresist film 110 is exposed using a mask, and then is developed to obtain photoresist patterns 112 and 114. Here, the first portion of the photoresist pattern 114 positioned at the channel portion C of the thin film transistor (that is, between the source electrode 65 and the drain electrode 66) is thinner than the second portion of the photoresist pattern 112 positioned at the data wiring portion A (that is, at the region where the data wirings 62, 64, 65, 66 and 68). The remaining portion of the photoresist patterns 112 and 114 is removed.

The thickness ratio between the photoresist pattern 114 remaining at the channel portion C and the photoresist pattern 112 remaining at the data wiring portion A is dependent on the processing conditions of a subsequent etching process. However, the preferred thickness of the first portion 114 is less than about ½ of the thickness of the second portion 112, for example, about 4,000 Å or less.

Various methods can be applied to differentiate the thickness of the photoresist layer according to its position. For example, a slit shaped or a lattice shaped pattern is formed or a semitransparent film is used to control a transmitting amount of light in region A.

When the slit is applied, the line width firmed between neighboring slits, the distance between neighboring patterns, i.e. the width of the slit is preferably smaller than the resolution of a stepper used for the exposure.

When the semitransparent film is used, a thin film having different transparency is used or a thin film having a different thickness can be used when manufacturing the mask in order to control the transparency.

When the photoresist layer is exposed to the light through the mask, polymer at the exposed portion is completely decomposed, polymer at the portion where the slit pattern or the semitransparent film is partially decomposed because the exposed amount of the light is insufficient, and polymer at the shield portion does not decomposed. When the photoresist is developed, the decomposed polymer is removed while the polymer not decomposed remains. Meantime, even thinner photoresist layer remains at the central portion where the partially decomposed polymer is. If the exposing time is lengthened, almost all the partially decomposed polymer is decomposed. Therefore, the exposing time should be controlled appropriately.

The thin photoresist layer 114 also can be formed by forming a photoresist layer formed using a material which can reflow, exposing the photoresist layer using a mask including a portion where a light can pass completely and a portion where the light can be completely shielded, developing the exposed photoresist layer and then reflowing thus obtained photoresist layer to reflow a portion of the remaining photoresist pattern to the completely developed out region.

After that, the photoresist pattern 114 and underlying Conductive layer 60, the intermediate layer 50 and the semiconductor layer 40 are etched. Here, the data wiring and underlying layers should remain at the wiring portion A, and the semiconductor layer should remain at the channel region C. At the remaining portion B, three layers 60, 50 and 40 should be completely removed to expose the gate insulating layer 30.

Figure 21:
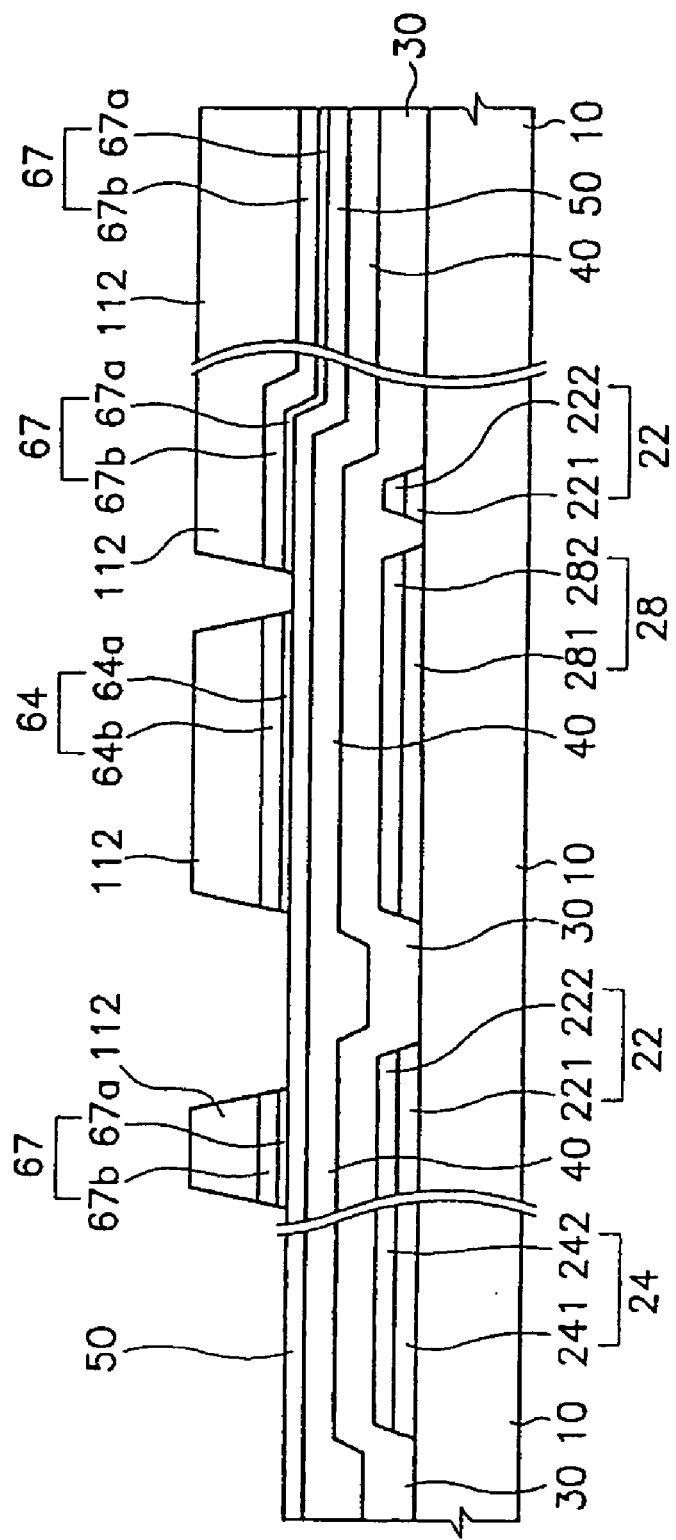
Figure 22:
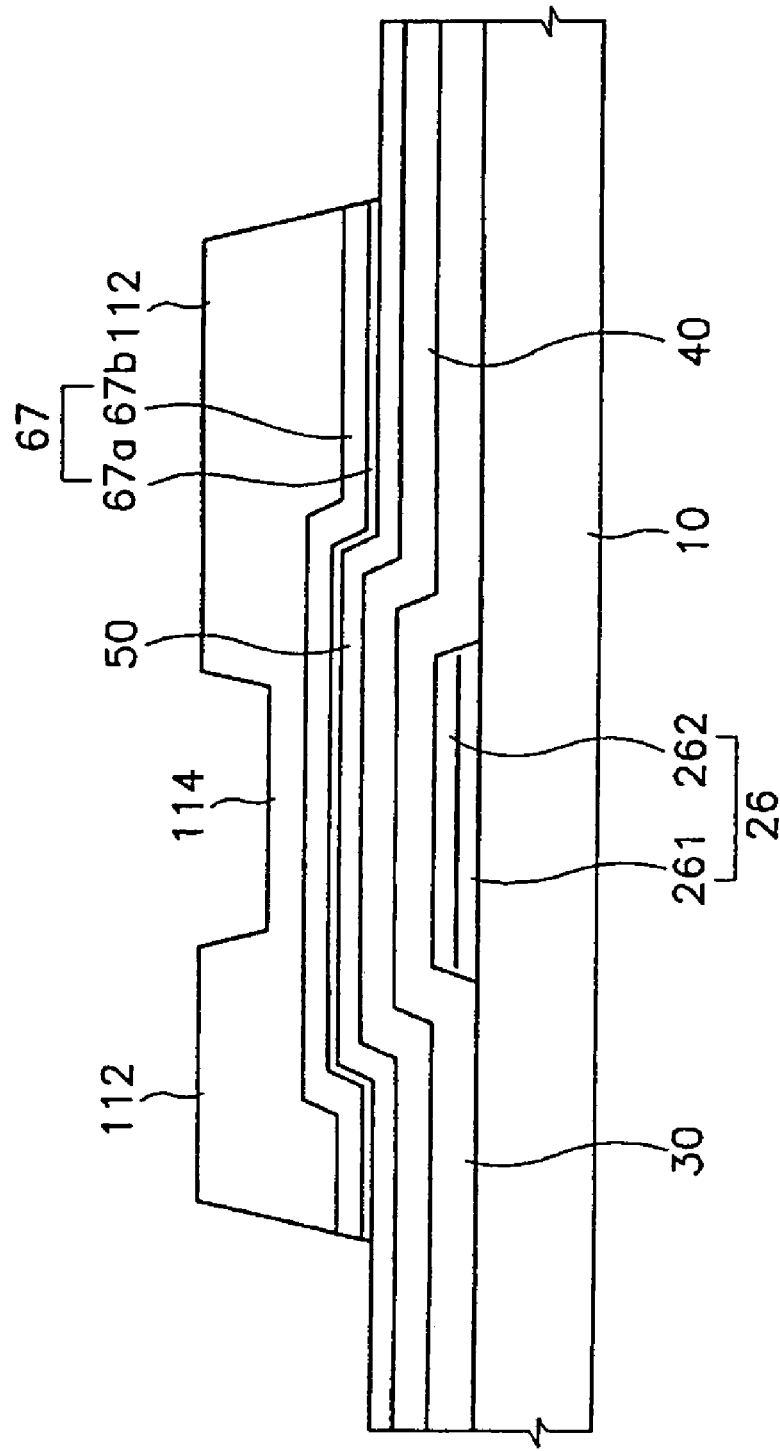

Referring to FIGS. 21 and 22, the conductive layer 60 exposed at the remaining portion B is removed to expose underlying intermediate layer 50. This exposing process may be implemented as dry etching or wet etching. According to the preferred etching conditions, the conductive layer 60 is etched while the photoresist patterns 112 and 114 are rarely etched. However, the condition by which only the conductive layer 60 is etched while the photoresist patterns 112 and 114 are not etched, is difficult to find according to the dry etching. Therefore, the condition of etching the conductive layer 60 along with the photoresist patterns 112 and 114 might be applied. Here, the thickness of the photoresist layer at the first portion 114 is obtained to be thicker than that when applying the wet etching so as not to remove the first portion 114 and to expose the underlying conductive layer 60.

Then, the conductive layer at the channel portion C and the data wiring portion B, that is, the conductive pattern for the source/drain 67 (67a, 67b) and the conductive pattern for the holding storage capacitor 68 (68a, 68b) remains and the conductive layer 60 at the remaining portion B is completely removed to expose underlying intermediate layer 50, as illustrated in FIGS. 21 and 22. Here, the remaining conductive patterns 67 (67a, 67b) and 64 (64a, 64b) have the similar shape as the data wirings 62 (62a, 62b), 65 (65a, 65b), 66 (66a, 66b) and 68 (68a, 68b), except that the source/drain electrodes 65 (65a, 65b) and 66 (66a, 66b) are not separated but connected. In addition, when the dry etching method is applied, the photoresist patterns 112 and 114 also are etched to some degree.

Figure 23:
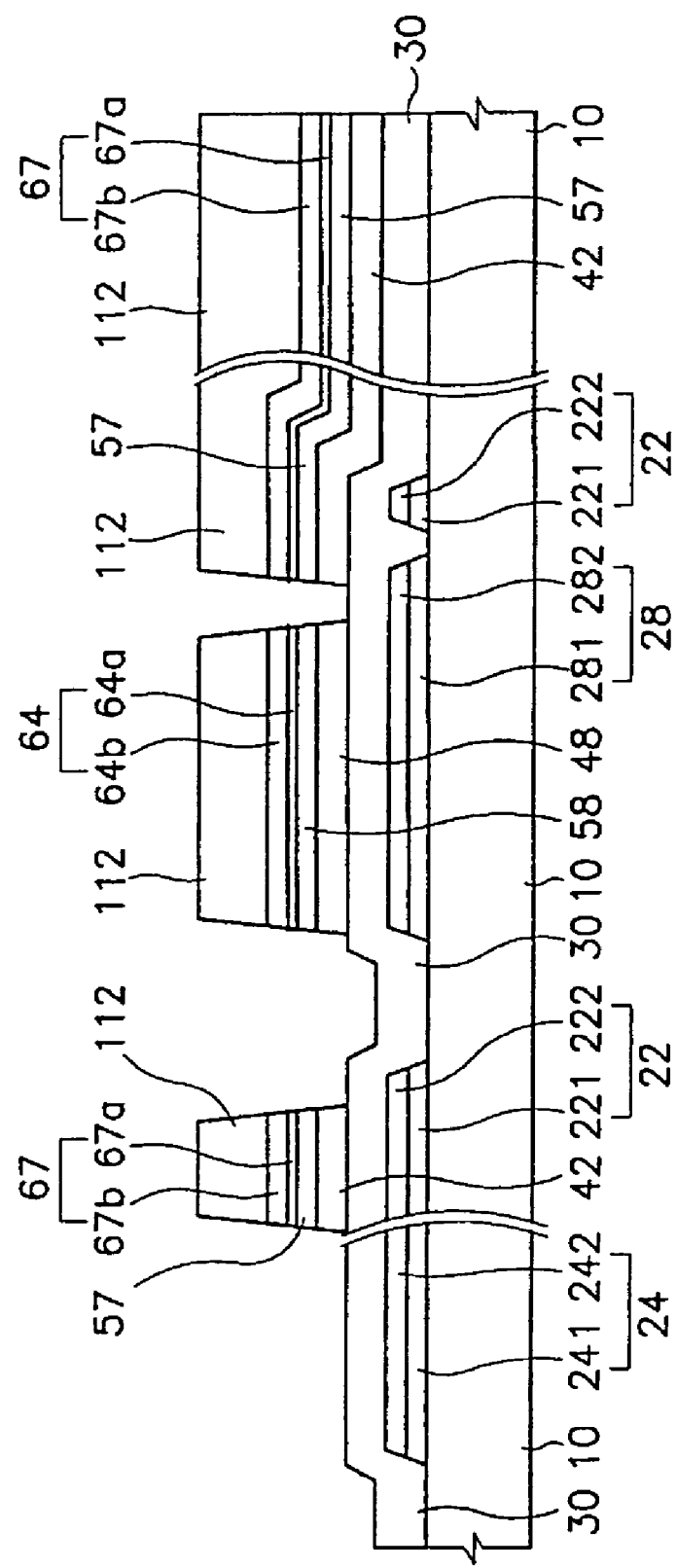
Figure 24:
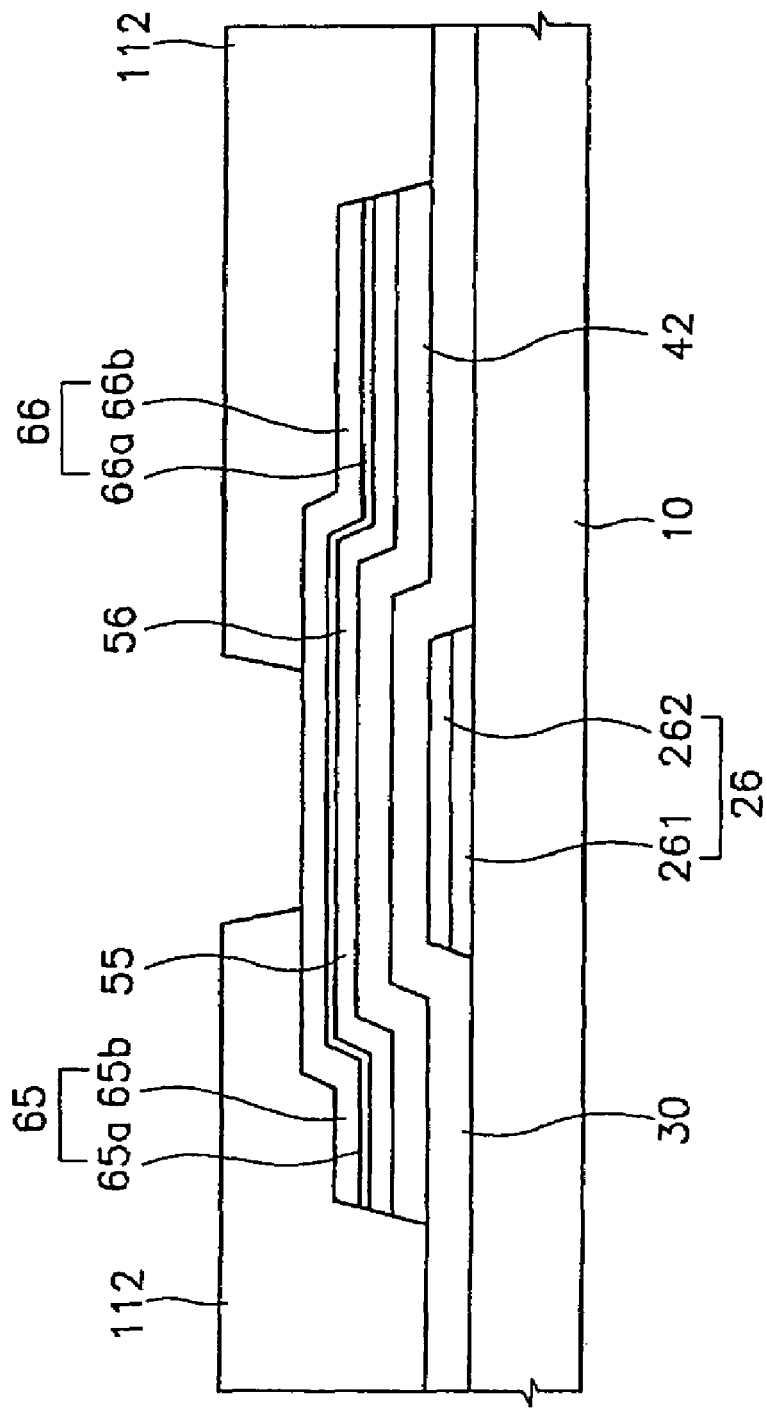

Referring to FIGS. 23 and 24, the exposed intermediate layer 50 at the remaining portion B and the semiconductor layer 40 underlying thereof are removed by using a dry etching method along with the first portion 114 of the photoresist layer. At this time, the photoresist patterns 112 and 114, the intermediate layer 50 and the semi-conductor layer 40 (almost no etching selectivity between the semiconductor layer and the intermediate layer) are etched simultaneously and the gate insulating layer 30 is not etched. In particular, according to the etching condition, the etching ratios of the photoresist patterns 112 and 114 and the semiconductor layer 40 are similar. For example, when a mixture gas of $SF_6$ and HCl or a mixture gas of $SF_6$ and $O_2$ is used as the etching gas, the two layers can be etched with almost the same etching ratios. When the etching ratios with respect to the photoresist patterns 112 and 114 and to the semiconductor layer 40 are the same, the thickness of the first portion 114 should be the same or less than the sum of the thickness of the semiconductor layer 40 and the intermediate layer 50.

The first portion 114 of the channel portion C is removed to expose the conductive pattern 67 (67a, 67b) for the source/drain, and the intermediate layer 50 and the semi-conductor layer 40 of the remaining portion B are removed to expose underlying gate insulating layer 30, as illustrated in FIGS. 23 and 24.

Meantime, the second portion 112 of the data wiring portion A also is etched and the thickness thereof is reduced. In addition, the semiconductor patterns 42 and 48 are completed at this stage. The reference numeral 57 and 58, respectively, indicates an intermediate pattern under the conductive pattern 67 (67a, 67b) for the source/drain and an intermediate pattern under the conductive pattern 64 (64a, 64b) for the holding storage capacitor.

Remaining photoresist residue on the surface portion of the conductive pattern 67 (67a, 67b) for the source/drain of the channel portion C is removed by an ashing process.

Figure 25:
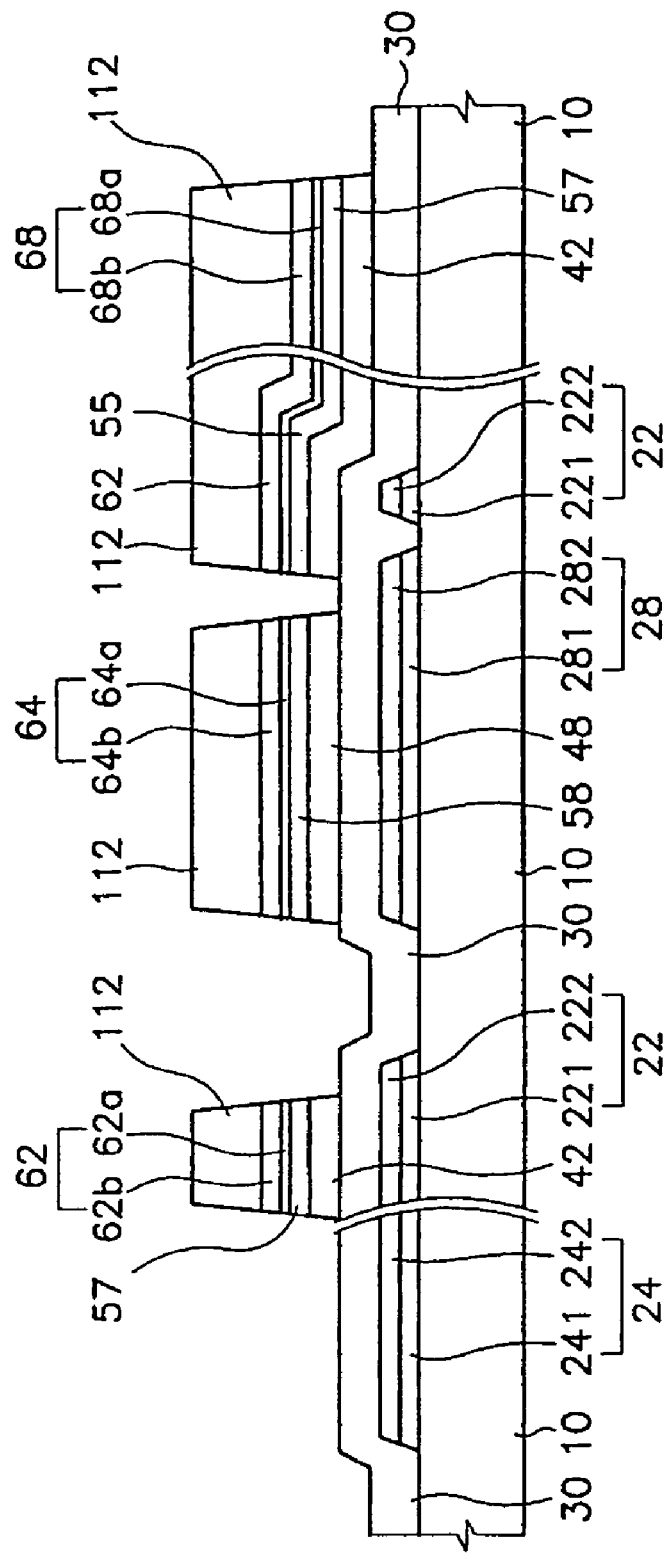
Figure 26:
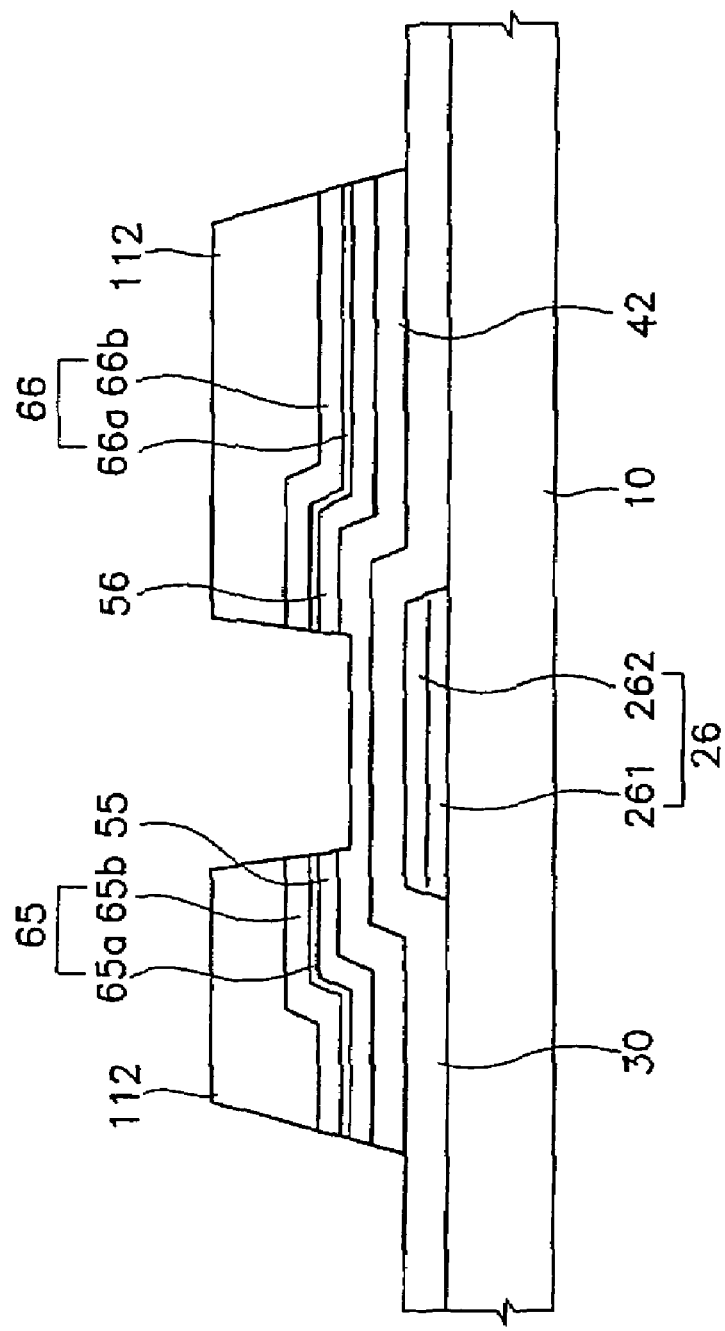

Referring to FIGS. 25 and 26, the conductive pattern 67 (67a, 67b) for the source/drain of the channel C and the intermediate pattern 57 for the source/drain under the conductive pattern 67 are etched to remove. At this time, both the conductive pattern 67 for the source/drain and the intermediate pattern 57 can be etched by a dry etching process. Otherwise, the conductive pattern 67 for the source/drain can be etched by a wet etching process and the intermediate pattern 57 can be etched by a dry etching process. When applying the former method, the etching is preferably implemented under the condition of having a large etching selectivity for the conductive pattern 67 for the source/drain and the intermediate pattern 57. When the etching selectivity is not large, a determination of an end point of the etching is difficult and the control of remaining semiconductor pattern 42 at the channel portion C is not an easy task. When applying the latter method including both the wet etching and the dry etching processes, the side portion of the conductive pattern 67 for the source/drain may be wet etched. However, the side portion of the intermediate pattern 57 is rarely etched by the dry etching process. Therefore, a stepped shape is obtained. For etching the intermediate pattern 57 and the semiconductor pattern 42, an etching gas such as a mixture gas of $CF_4$ and HCl or a mixture gas of $CF_4$ and $O_2$ can be used. When the mixture gas of $CF_4$ and $O_2$ is used as the etching gas, the semiconductor pattern 42 having uniform thickness can be formed. Here, a portion of the semiconductor pattern 42 might be removed to lessen the thickness thereof, as illustrated in FIG. 26 and the second portion 112 of the photoresist pattern is removed to some degree, simultaneously. During implementing the etching, the gate insulating layer 30 should not be etched and the data wirings 62, 64, 65, 66 and 68 formed under the second portion 112 of the photoresist pattern should not be exposed due to an excessive etching of the photoresist pattern. To avoid the exposure of the data wirings, the photoresist pattern is preferably formed to a sufficient thickness.

The source electrode 65 and the drain electrode 66 are separated and the data wirings 62, 64, 65, 66 and 68 and underlying contact patterns 55, 56 and 58 are completed.

Then, the second portion of the photoresist pattern 112 remaining at the data wiring portion A is removed. However, the removal of the second portion of the photoresist pattern 112 can be carried out after removing the Inductive pattern 67 for the source/drain of the channel portion C and before removing underlying intermediate pattern 57.

As described above, the etching can be executed by alternately applying the wet etching and the dry etching processes or by applying only the dry etching process. When applying only the dry etching, the etching process is relatively simple; however, the determination of an appropriate etching condition is difficult. When applying both the wet etching and the dry etching, the determination of the appropriate etching condition is relatively easy, however, the processing is complicated.

Figure 27:
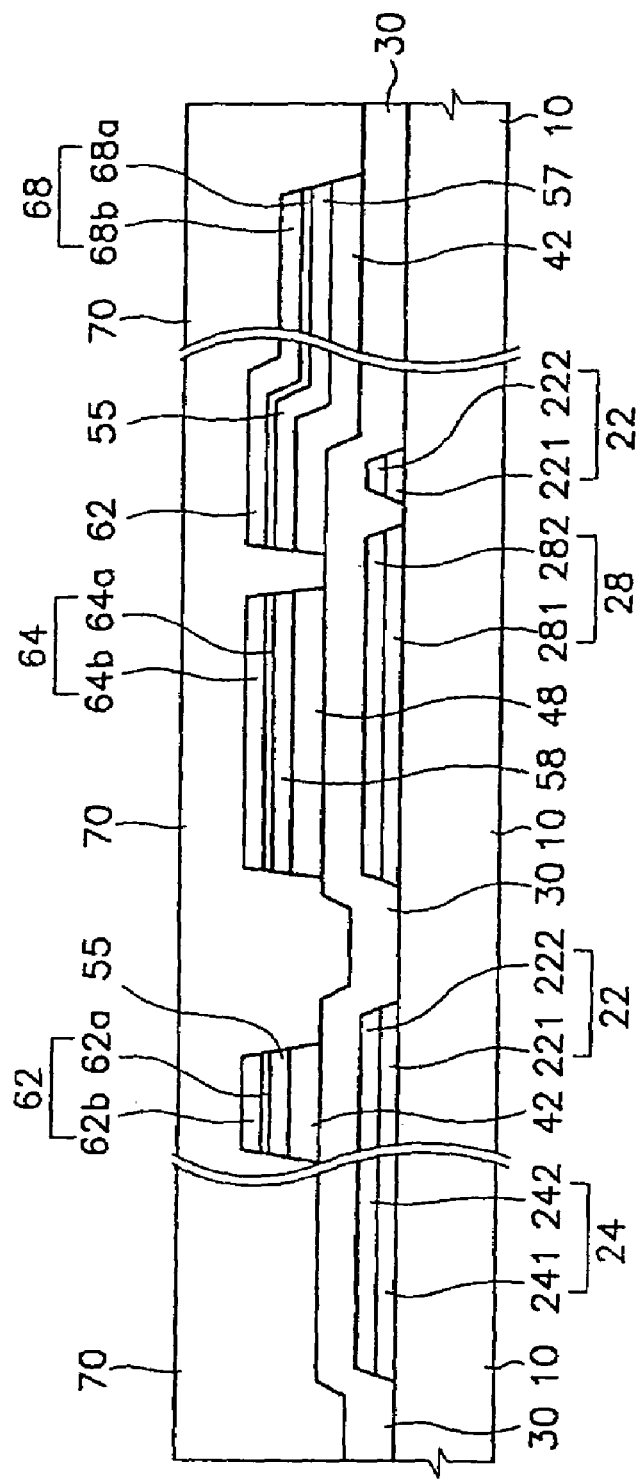
Figure 28:
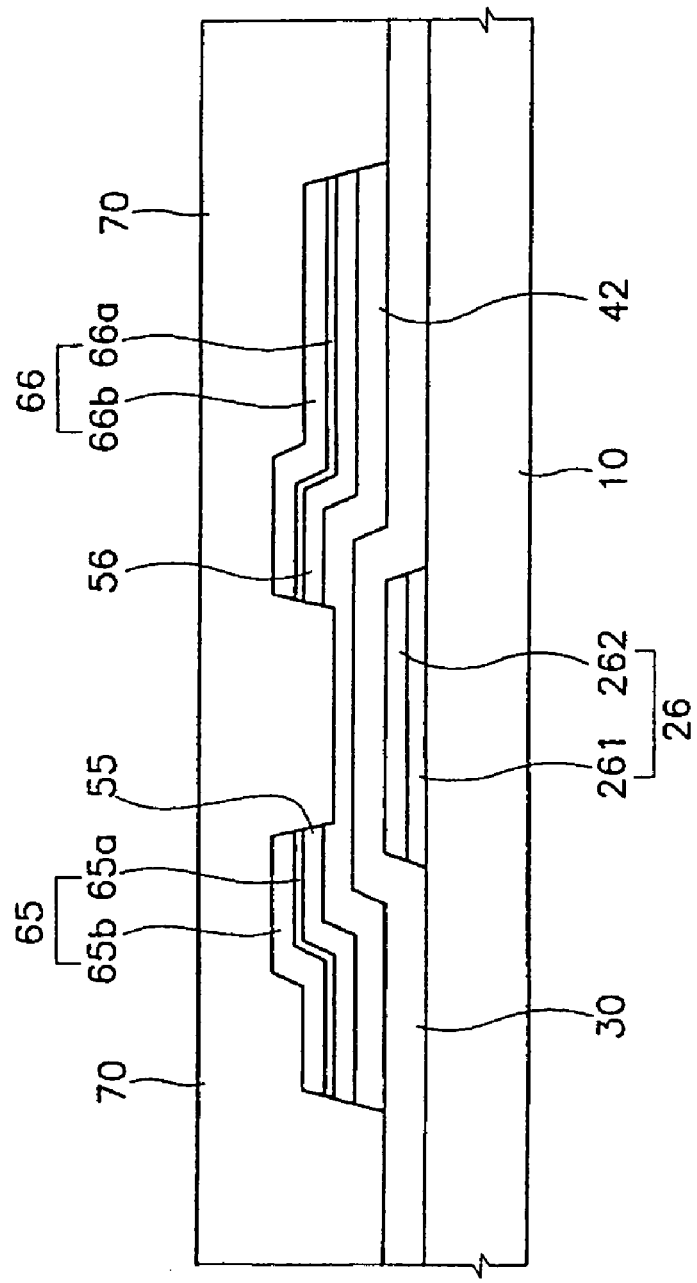

Referring to FIGS. 27 and 28, a passivation layer 70 is formed on the resultant structure.

Figure 29:
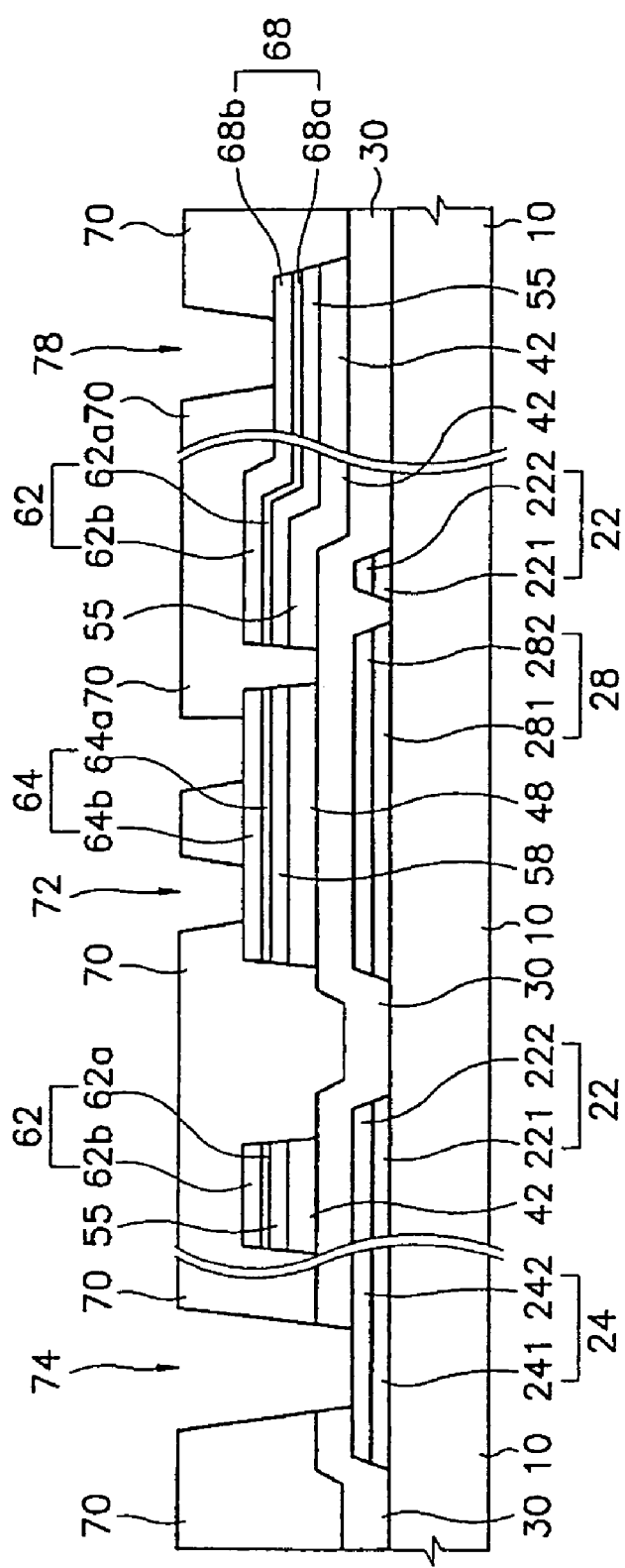
Figure 30:
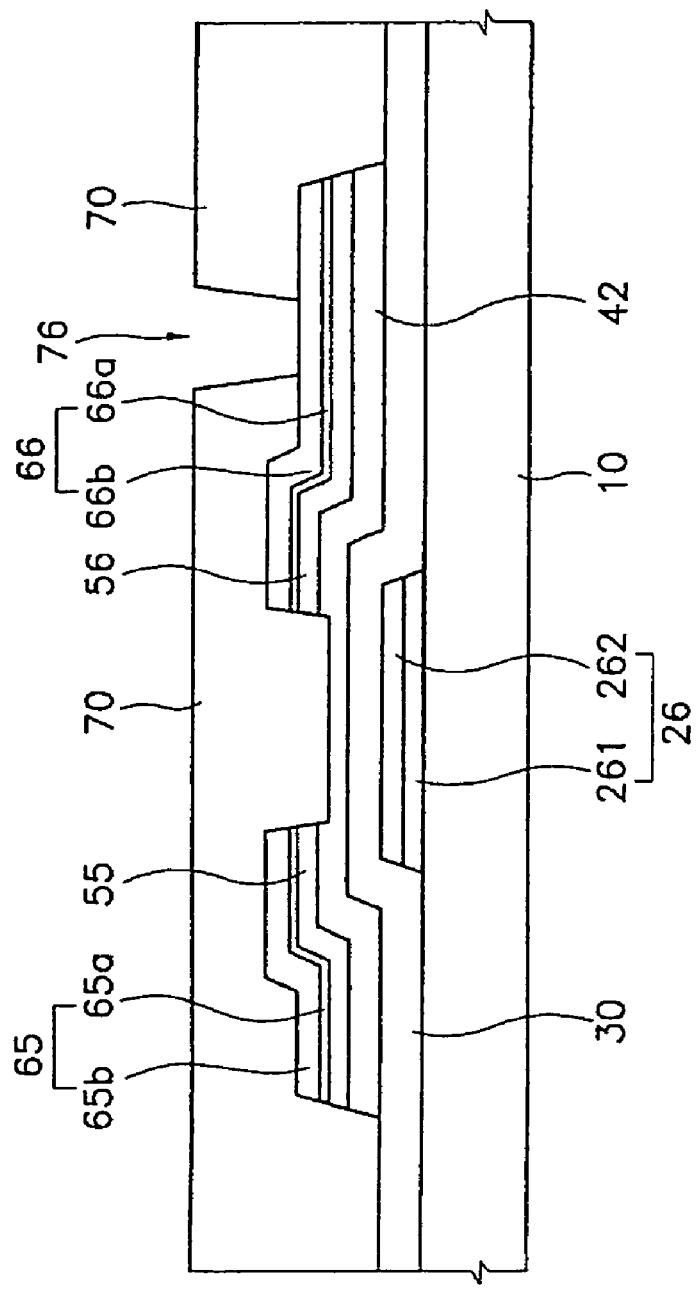

Referring to FIGS. 29 and 30, the passivation layer 70 is etched along with the gate insulating layer 30 by a photolithography process to form contact holes 76, 74, 78 and 72 for exposing the drain electrode 66, the gate pad 24, the data pad 68 and the conductive pattern for the holding storage capacitor 64, respectively. Here, the preferred area of the contact holes 74 and 79 for exposing the pads 24 and 68 is from about 0.5 mm×about 15 µm and to about 2 mm×about 60 µm.

Referring now to FIGS. 12 to 14, ITO is deposited to a thickness of about 400 to about 500 Å and then is etched by a photolithography process to form a pixel electrode 82 connected to the drain electrode 66 and the conductive pattern for the holding storage capacitor 64, an auxiliary gate pad 86 connected to the gate pad 24 and an auxiliary data pad 88 connected to the data pad 68.

Meantime, nitrogen gas is preferably used as a gas applied during a pre-heating process before depositing ITO in order to prevent the formation of a metal oxide on metal layers 24, 64, 66 and 68 exposed by the contact holes 72, 74, 76 and 78.

According to this embodiment of the present invention, in addition to the effect obtainable by one embodiment, the data wirings 62, 64, 65, 66 and 68, underlying contact patterns 55, 56 and 58 and the semiconductor patterns 42 and 48 are formed using one mask. Also, the source electrode 65 and the drain electrode 66 are separated during the process to simplify the manufacturing process.

The method of the present invention also can be applied to an array on color filter (AOC) structure by which the thin film transistor array is formed on a color filter.

Figure 31:
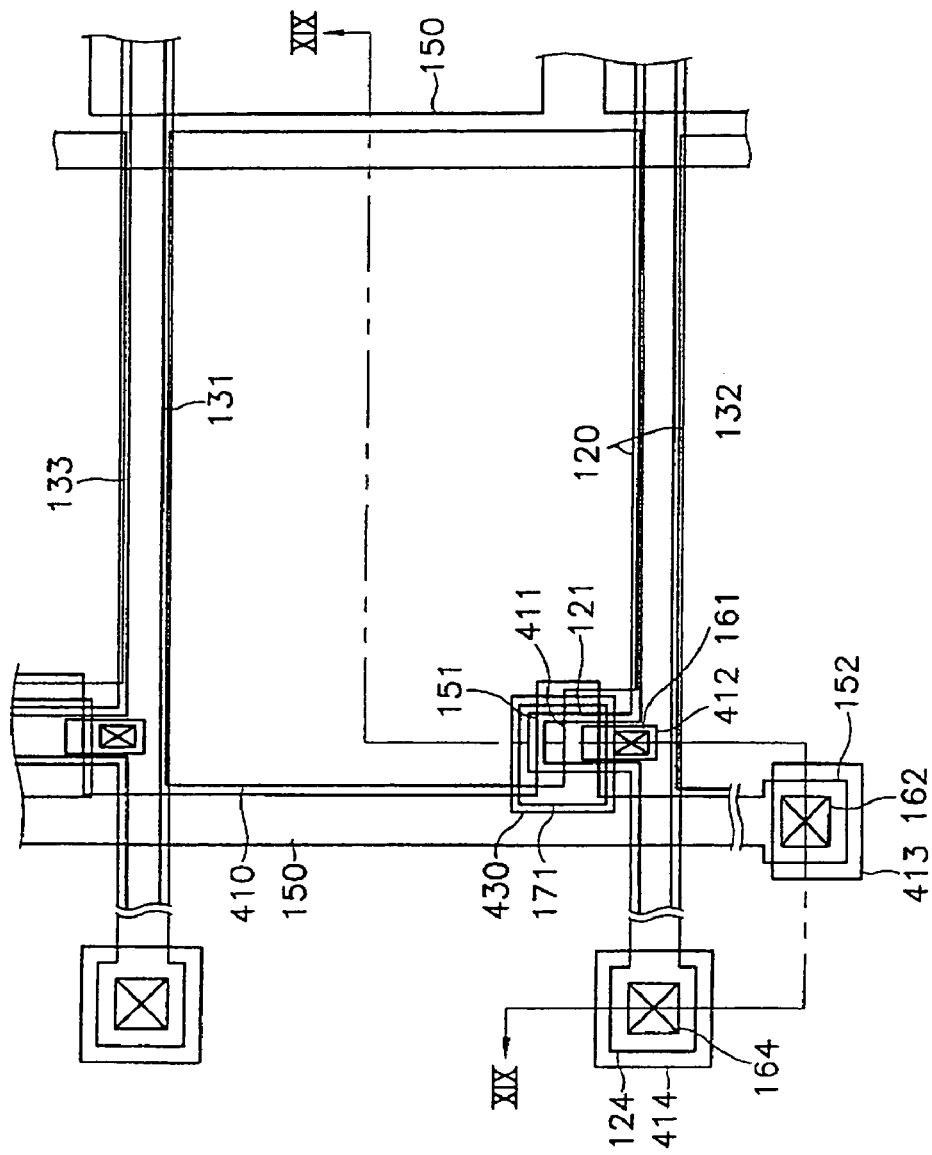
FIG. 31 is a schematic perspective view of a thin film transistor substrate of a liquid crystal display device according to an embodiment of the present invention.
Figure 32:
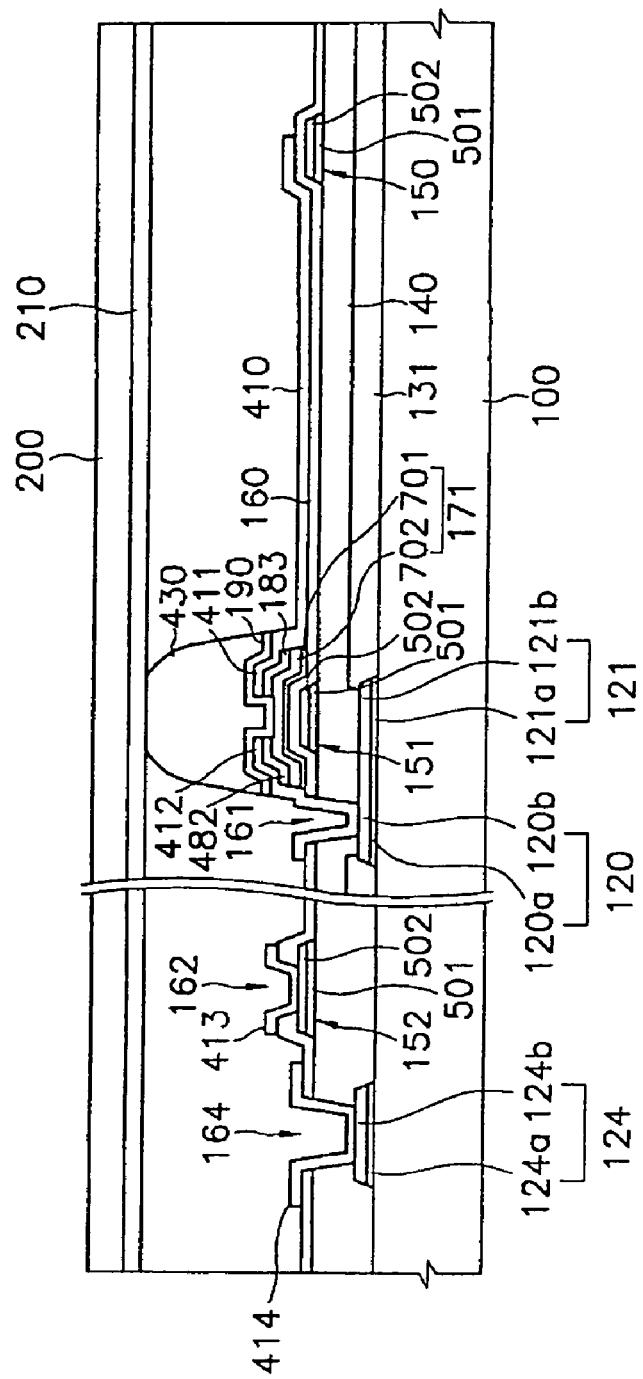
FIG. 32 is a cross-sectional view taken along the line of XIX-XIX' in FIG. 31.

FIG. 31 is a schematic perspective view illustrating a thin film transistor substrate of an LCD device according to one embodiment of the present invention and FIG. 32 is a cross-sectional view taken along the line of XIX-XIX' in FIG. 31. In FIG. 32, a lower substrate of the thin film transistor and an upper substrate facing the lower substrate are illustrated together.

First, on the lower insulating substrate 100, data wirings 120, 121 and 124 including nickel-silicide layers 120a, 121a and 124a and chrome layers 120b, 121b and 124b, are formed.

The data wirings 120, 121 and 124 include a data line 120 extended along the vertical direction, a data pad 124 connected to an end portion of the data line 120 for receiving external image signals and transmitting the image signals to the data line 120, and a light shielding portion 121 divided from the data line 120 for shielding incident light from the lower portion of the substrate 100 to a semiconductor layer 170 of the thin film transistor. Here, the light shielding portion 121 also functions black matrix for shielding leaky light and can be formed as a separate wiring from the data line 120.

On the lower insulating substrate 100, color filters of red (R), green (G), blue (B) 131, 132 and 133, of which edge portion overlaps the edge portion of the data lines 120 and 121, are formed. Here, the color filters 131, 132 and 133 can be formed so as to cover all the data line 120.

On the data wirings 120, 121 and 124 and the color filters 131, 132 and 133, a buffering layer 140 is formed. The buffering layer 140 prevents out-gassing from the color filters 131, 132 and 133 and prevents the damage of the color filters by heat and plasma energy during a subsequent process. In addition, the buffering layer 140 separates the lowermost data wirings 120, 121 and 124 from the thin film transistor array. Therefore, the buffering layer 140 is preferably formed to have a low dielectric constant and an increased thickness to reduce parasitic capacity between them.

On the buffering layer 140, a gate wiring including double layers of a lower layer 501 formed using chrome, aluminum-neodymium complex, etc and an upper layer 502 formed using aluminum-neodymium complex, molybdenum, etc is formed.

The gate wiring includes a gate line 150, extended in the longitudinal direction crossing the data line 120 to define a unit pixel, a gate pad 152 connected to an end portion of the gate line 150 and receiving external scanning signals and transmitting to the gate line 150, and a gate electrode 151 of the thin film transistor corresponding to a portion of the gate line 150. Here, the gate line 150 overlaps a pixel electrode 410 to from a holding storage battery for improving charge maintaining capacity of the pixel. When holding capacity produced by an overlap of the pixel electrode 410 and the gate line 150 is insufficient, a common electrode for the holding capacity also can be formed.

When the gate line includes double layers, one layer is preferably formed using material having low resistance and the other layer is preferably formed using material having good contact property with other materials.

On the gate wirings 150, 151 and 152 and the buffer layer 140, a low temperature deposited gate insulating layer 160 is formed. Here, the low temperature deposited gate insulating layer 160 can be formed as an organic insulating layer, a low temperature amorphous silicon oxide layer, a low temperature amorphous silicon nitride layer, etc According to the thin film transistor of the present invention, the color filter is formed on the lower substrate. Therefore, the commonly formed insulating layer formed by depositing at a high temperature is not preferred, but a low temperature deposited insulating layer formed by depositing at temperature of about 250° C. or less, is preferred.

On the gate insulating layer 160 of the gate electrode 151, a semiconductor layer 171 including double layers, is formed as an island shape. The double layered semiconductor layer 171 includes a lower semiconductor layer 701 formed using amorphous silicon having a high band gap and an upper semiconductor layer 702 formed using common amorphous silicon having a lower band gap when comparing with the lower semiconductor layer 701. For example, the band gap of the lower semiconductor layer 701 is set to about 1.9 to about 2.1 eV and the band gap of the upper semiconductor layer 702 is set to about 1.7 to about 1.8 eV. Here, the lower semiconductor layer 701 is formed to a thickness of about 50 to about 200 Å and the upper semiconductor layer 702 is formed to a thickness of about 1,000 to about 2,000 Å.

Between the upper semiconductor layer 702 and the lower semiconductor layer 701 having different band gaps, a band offset corresponding to the difference of the two layers is formed. When TFT is set to on, a channel is formed in the band off-set region formed between the two semiconductor layers 701 and 702. Since this band off-set region basically has the same atomic structure, good TFT property having little defect is expected. Of course, the semiconductor layer 171 can be formed as a single layer.

On the semiconductor layer 171, ohmic contact layers 182 and 183, including amorphous silicon highly doped by an n-type impurity such as phosphor (P), minutely crystallized silicon or metal silicide, etc are separately formed.

On the ohmic contact layers 182 and 183, pixel wirings 410, 411 and 412 formed using ITO and including a source electrode and a drain electrode 412 and 411 and a pixel electrode 410, are formed. The source electrode 412 is connected to the data line 120 through a contact hole 161 formed at the gate insulating layer 160 and the buffering layer 140. The drain electrode 411 is connected to the pixel electrode 410 and receives image signals from the thin film transistor and then transmits to the pixel electrode 410. The pixel wirings 410, 411 and 412 are formed using a transparent conductive material.

In addition, at the same layer of the pixel wirings 410, 411 and 412, an auxiliary gate pad 413 and an auxiliary data pad 414, which are respectively connected to the gate pad 152 and the data pad 124 through the contact holes 162 and 164 are formed. Here, the auxiliary gate pad 413 directly contacts a molybdenum-tungsten complex layer, which is an upper layer 502 of the gate pad 152, and the auxiliary data pad 414 directly contacts a copper complex layer, which is an upper layer 202 of the data pad 124. The pixel electrode 410 also overlaps neighboring gate line 150 and data line 120 to improve aperture efficiency; however, they might not overlap.

On the source and drain electrodes 412 and 411, a passivation layer 190 for passivating the thin film transistor is formed and a photosensitive and colored organic layer 430, having dark color and high light absorbing property, is formed thereon. Here, the colored organic layer 430 functions to shield an incident light to the semi-conductor layer 171 of the thin film transistor. The colored organic layer 430 can be used as a spacer for keeping a distance between the lowering insulating substrate 100 and the fading upper insulating substrate 200 by controlling the height of the organic layer 430. Here, the passivation layer 190 and the organic layer 430 can be formed along the gate line 150 and the data line 120. The organic layer 430 also has a function of shielding leaky light around the gate wiring and the data wiring.

Meantime, a common electrode 210 is formed using ITO or IZO on the upper substrate 200. The common electrode 210 generates electric field with the pixel electrode 410.

Hereinafter, a method of manufacturing a thin film transistor substrate according to one embodiment of the present invention will be described with reference to attached FIGS. 33 to 40 and FIGS. 31 and 32.

Figure 33:
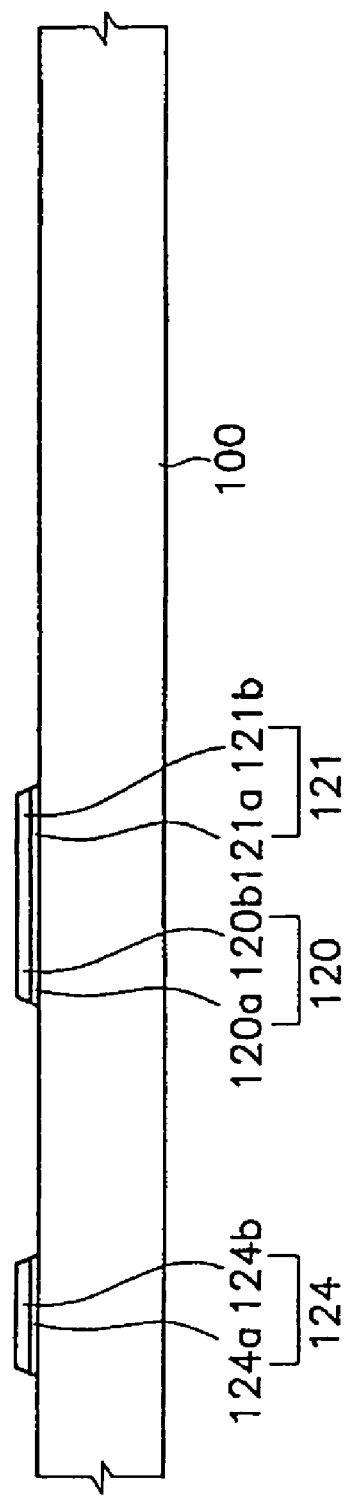
FIGS. 33 to 40 are cross-sectional views illustrating a method of manufacturing a thin film transistor substrate of a liquid crystal display device according to an embodiment of the present invention.

Referring to FIG. 33, nickel is deposited to a thickness of about 100 Å and chromium is deposited to a thickness of about 4000 Å and then is heat treated at temperature of about 260° C. for about 1 hour under an air atmosphere to transform the nickel layer to a nickel-silicide layer. On the nickel-silicide layer, data wirings 120, 121 and 124 including a data line 120 (120a, 120b), a data pad 124 (124a, 124b) and a light shielding portion 121 (121a, 121b) is formed on the lower insulating substrate 100 using a mask and a photolithography and an etching process such as a dry etching or a wet etching process.

Figure 34:
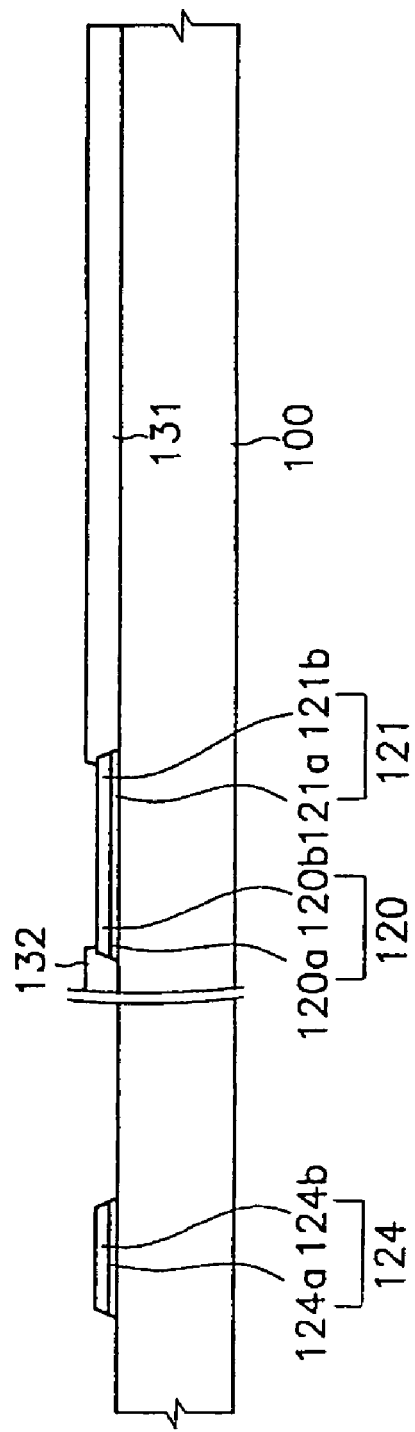

Referring to FIG. 34, photoresist materials including pigments of red (R), green (G) and blue (B) are subsequently coated and patterned using a mask and a photolithography process to subsequently form red (R), green (G) and blue (B) color filters 131, 132 and 133. Here, The red (R), green (G) and blue (B) color filters 131, 132 and 133 can be formed using three masks or can be formed using only one mask by shifting in order to save the producing cost. Alternately, a laser transferring method or a printing method also can be used without using the mask to minimize the producing cost. The edge portions of the red (R), green (G) and blue (B) color filters 131, 132 and 133 preferably overlap the data line 120.

Figure 35:
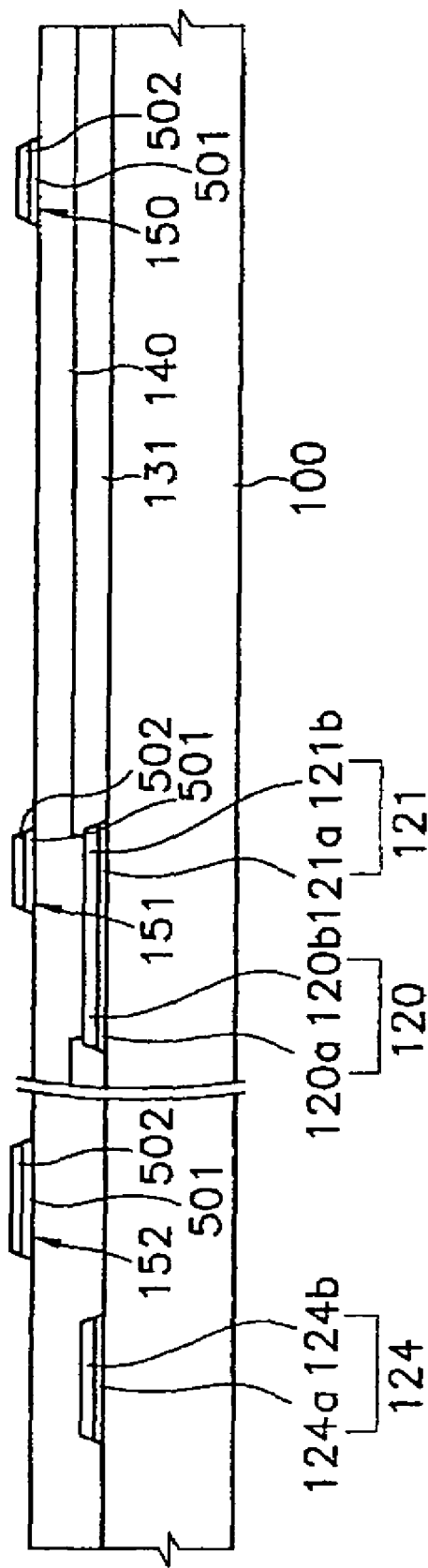

Referring to FIG. 35, a buffering layer 140 is formed on the insulating substrate 100. After that, a conductive material such as aluminum complex, molybdenum and molybdenum complex is deposited by using a depositing method such as a sputtering method and then patterned using a mask and a photolithography process, to form gate wirings 150, 151 and 152 including a gate line 150, a gate electrode 151 and a gate pad 152 on the buffering layer 140. Here, the gate wirings 150, 151 and 152 can be formed to a single layer.

Figure 36:
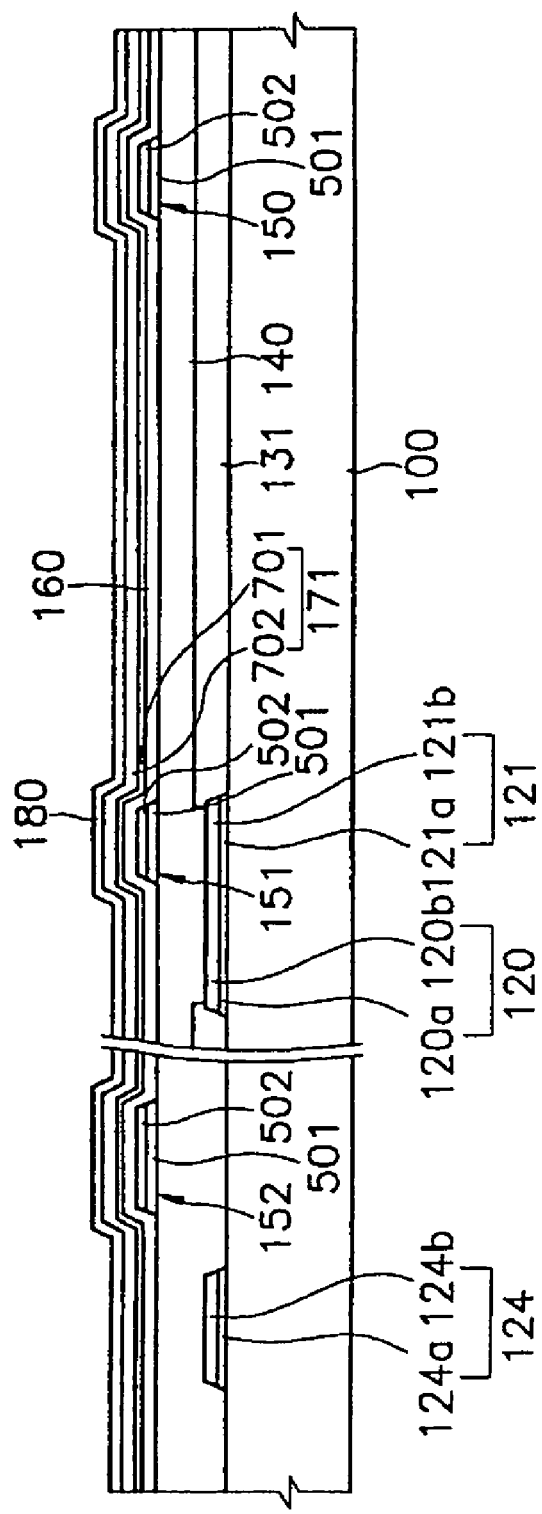

Referring to FIG. 36, on the gate wirings 150, 151 and 152 and the organic insulating layer 140, a low temperature deposited gate insulating layer 160, a first amorphous silicon layer 701, a second amorphous silicon layer 702 and an impurity doped amorphous silicon layer 180 are continuously deposited.

The low temperature deposited gate insulating layer 160 can be formed as an organic insulating layer which can be deposited at a deposition temperature of about 250° C. or less, a low temperature amorphous silicon oxide layer, a low temperature amorphous silicon nitride layer, etc.

The first amorphous silicon layer 701 is preferably formed as an amorphous silicon layer having a high band gap, for example, about 1.9 to about 2.1 eV and the second amorphous silicon layer 702 is preferably formed as a common amorphous silicon layer having a lower band gap, for example, about 1.7 to about 1.8 eV, when comparing with that of the first amorphous silicon layer 701. At this time, the first amorphous silicon layer 701 can be formed by a CVD process using a raw material gas of $SiH_4$ with an appropriate amount of $CH_4$, $C_2H_2$ or $C_2H_6$. For example, $SiH_4$ and $CH_4$ in a mixing ratio of about 1:9 are injected into a CVD apparatus and a depositing process is executed to deposit an amorphous silicon layer having a C content of about 50% and a band gap of about 2.0 to about 2.3 eV.

As described above, the band gap of the amorphous silicon layer is dependent on the processing condition of the deposition. The band gap of the amorphous layer can be advantageously controlled by controlling the additional amount of carbon within a range of about 1.7 to about 2.5 eV. Here, the low temperature deposited gate insulating layer 160, the first amorphous silicon layer 701, the second amorphous silicon layer 702 and the impurities doped amorphous silicon layer 180 can be continuously deposited within the same CVD apparatus without breaking vacuum.

Figure 37:
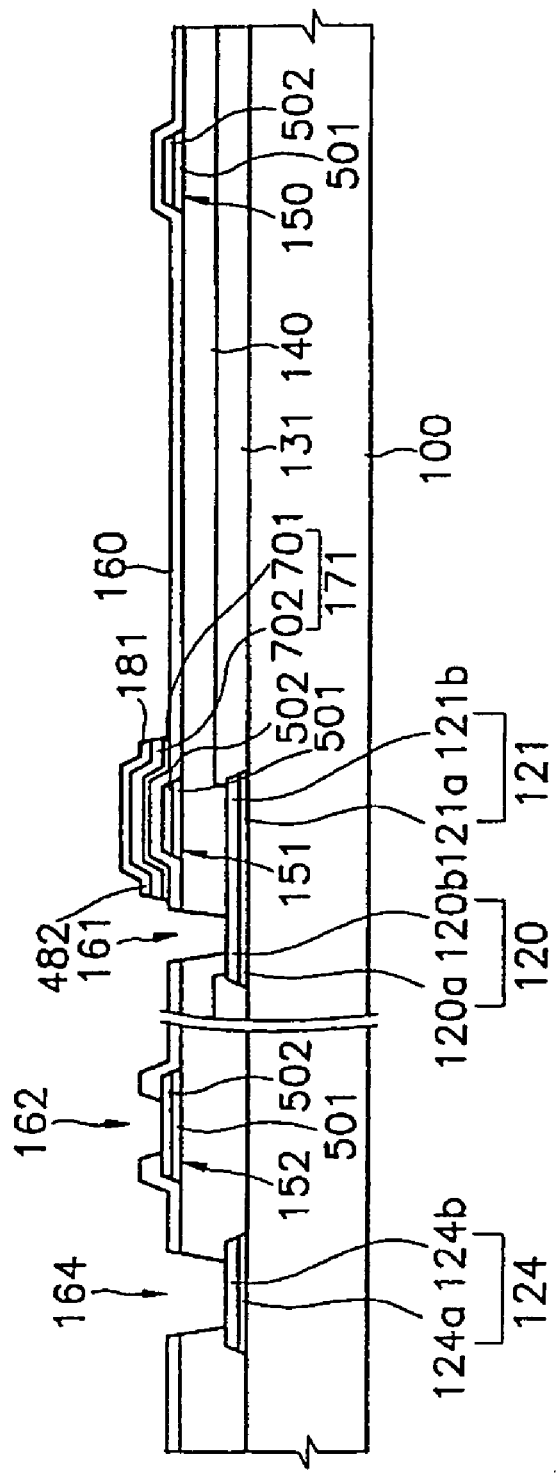

Referring to FIG. 37, the first amorphous silicon layer 701, the second amorphous silicon layer 702 and the impurities doped amorphous silicon layer 180 are patterned using a mask and a photolithography process to form a semiconductor layer 171 having an island shape and an ohmic contact layer 181. Here, contact holes 161, 162 and 164 are formed at the low temperature deposited gate insulating layer 160 to expose the data line 120, the gate pad 152 and the data pad 124, respectively. At this time, the first and the second amorphous silicon layers 701 and 702 and the impurities doped amorphous silicon layer 180 should be removed except at the upper portion of the gate electrode 151, however, at the upper portion of the gate pad 152, all the first and the second amorphous silicon layers 701 and 702 and the impurity doped amorphous silicon layer 180 should be removed along the gate insulating layer 160. At the upper portion of the data line 120 and the data pad 124, the first and the second amorphous silicon layers 701 and 702 and the impurity doped amorphous silicon layer 180 should be removed along with the low temperature deposited gate insulating layer 160 and the organic insulating layer 140.

In order to complete above-described processes using one mask and a photolithography process, a photoresist pattern having partially different thickness should be used as an etching mask. This process will be described in detail with reference to FIGS. 38 and 39.

Figure 38:
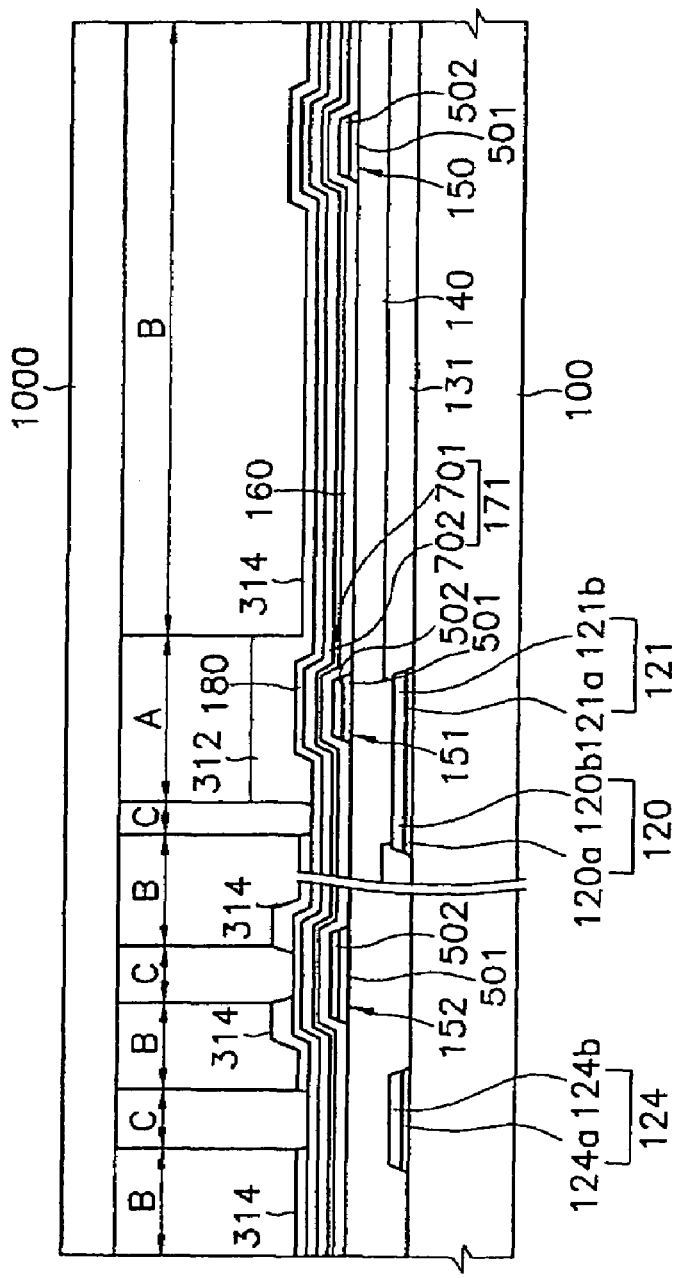

Referring to FIG. 38, on the impurity doped amorphous silicon layer 180, a photoresist film is deposited to a thickness of about 1 to about 2 μm and then, thus formed photoresist film is exposed to light and developed to obtain photoresist patterns 312 and 314.

Among the photoresist patterns 312 and 314, a first portion 312 provided above the gate electrode 151 is thicker than the second portion 314. Above a portion of the data line 120, the data pad 124 and the gate pad 152, the photoresist pattern should not be provided. Preferably, the thickness of the second portion 314 is about ½ or less of the thickness of the first portion 312, for example, about 4,000 Å or less.

Various methods can be applied to form a photoresist film having a different thickness according to a position as described above. Here, a method using a positive-type photoresist film will be described.

When the photoresist film is exposed through a mask 1000, which can control an exposing amount by providing a lattice shaped pattern or a semitransparent film on smaller patterns than the resolution of a stepper, for example B region, to control an exposing amount of light, decomposition degree of polymer is dependent on an amount or an intensity of the exposing light.

When the exposure is seized when polymer in the region C, which is a totally exposed region to light, is completely decomposed, the exposing amount of the light passing through the region B, in which the slit or the semitransparent film is formed, is relatively small. Therefore, a portion of the photoresist film in the region B is decomposed and the remaining portion is not decomposed. If the exposing time is lengthened, all the polymer molecules in the region B are decomposed. Accordingly, the exposing time should be carefully controlled.

When the photoresist film is developed, the first portion 312, where almost all the molecules contained therein is not decomposed, remains, the second portion 314, where a relatively smaller amount of light is exposed, remains to a thinner thickness than the first portion 312, and the portion corresponding to the region C, where the photoresist film is completely exposed, is completely removed. According to the above-described method, a photoresist pattern having partially different thickness according to a position can be formed.

Figure 39:
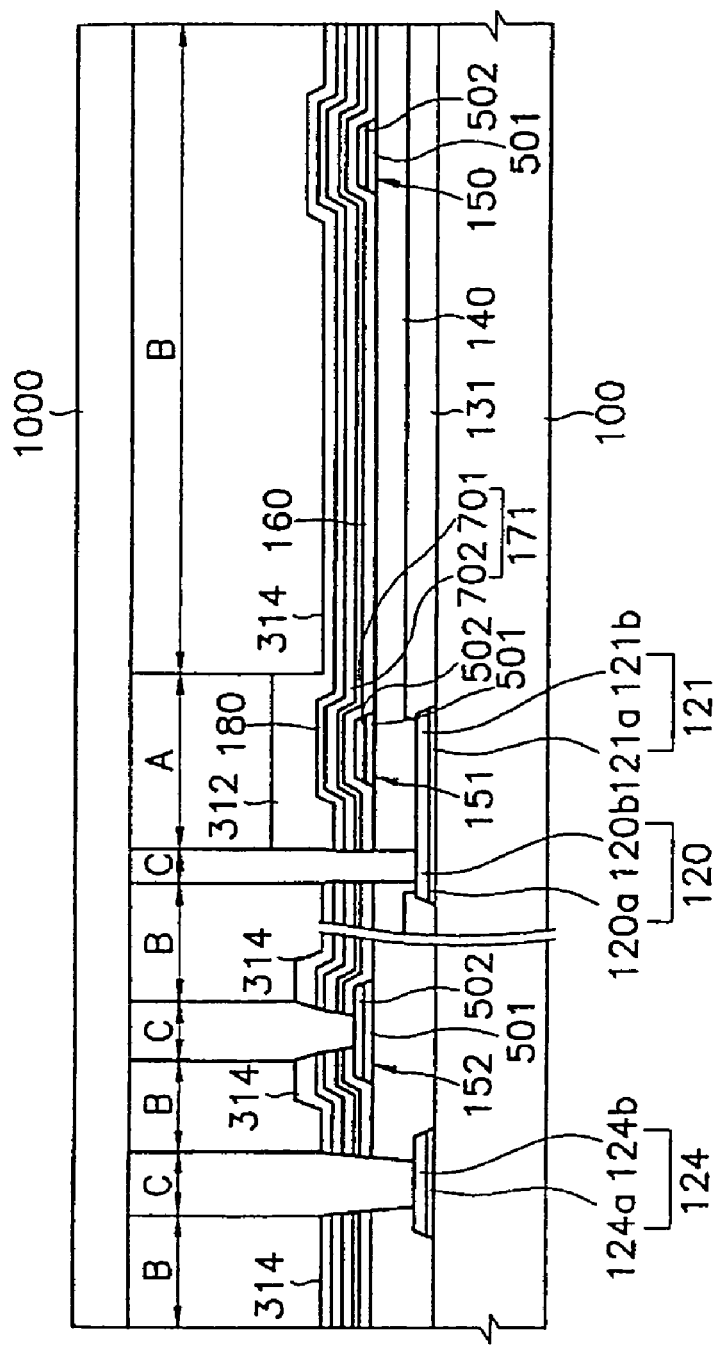

Referring to FIG. 39, the impurity doped amorphous silicon layer 180, the second amorphous silicon layer 702, the first amorphous silicon layer 701 and the low temperature deposited gate insulating layer 160 are dry etched using the photoresist patterns 312 and 314 as an etching mask to form a contact hole 162 for exposing the gate pad 152 and to expose the buffering layer 140 at the region C. Subsequently, the buffering layer 140 at the region C is dry etched by using the photoresist patterns 312 and 314 as a mask to form contact holes 161 and 164 to expose the data line 120 and the data pad 124.

Next, a process of completely removing the second portion of the photoresist pattern 314 is carried out. Here, an ashing process using oxygen can be added to completely remove residues of the second portion of the photoresist pattern 314.

Then, the second portion of the photoresist pattern 314 is removed, the impurity doped amorphous silicon layer 180 is exposed and the first portion of the photoresist pattern 312 remains. The thickness of the first portion of the photoresist pattern 312 is reduced to the same thickness of the second portion of the photoresist pattern 312.

After that, the impurity doped amorphous silicon layer 180 and underlying first and second amorphous silicon layers 701 and 702 are etched and removed by using the first portion of the photoresist pattern 312 as an etching mask, to remain the semi-conductor layer 171 and the ohmic contact layer 181 above the gate electrode 151 and on the low temperature deposited gate insulating layer 160 having an island shape.

Remaining first portion of the photoresist pattern 312 is removed. Here, an ashing process can be additionally implemented in order to completely remove the residue of the first portion of the photoresist pattern 312.

Figure 40:
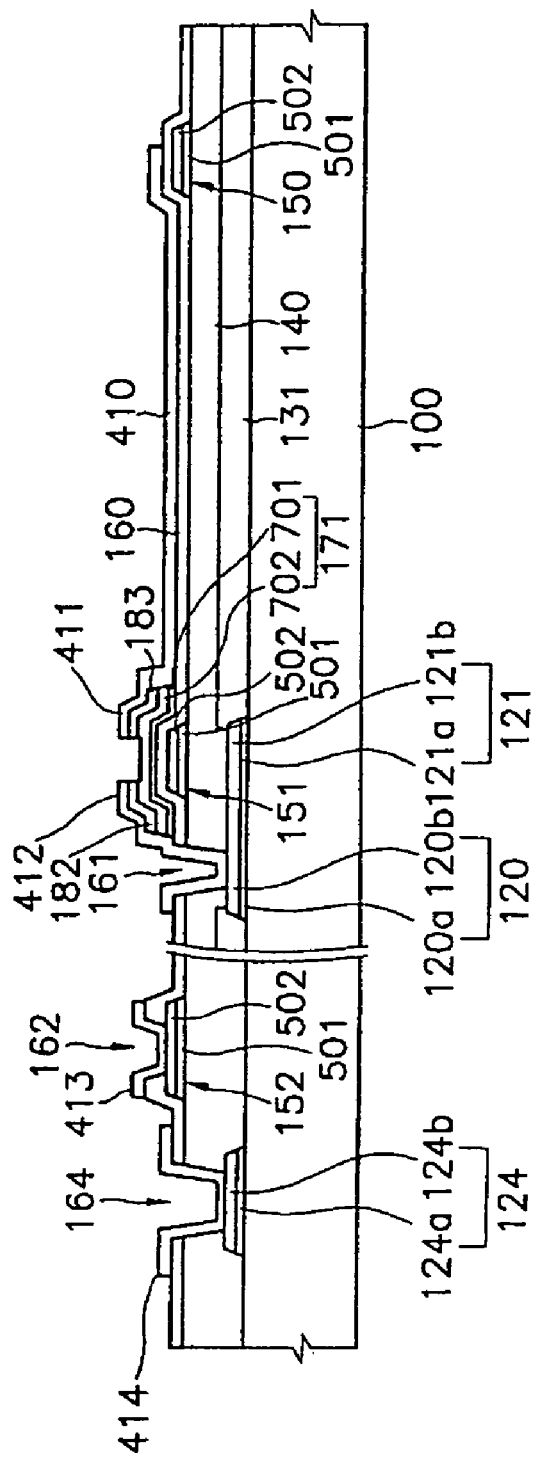

Referring to FIG. 40, an ITO layer is formed and then is patterned using a mask and a photolithography process to form the pixel electrode 410, the source electrode 412, the drain electrode 411, the auxiliary gate pad 413 and the auxiliary data pad 414.

The ohmic contact layer 181 is etched using the source electrode 412 and the drain electrode 411 as an etching mask to form two separated ohmic contact patterns 182 and 183 and to expose the semiconductor layer 171 between the source electrode 412 and the drain electrode 411.

Referring to FIGS. 31 and 32, an insulating material such as silicon nitride, silicon oxide, etc and an insulating material such as a photosensitive organic material including black pigments are subsequently integrated on the lower insulating substrate 100, and then, thus formed layers are exposed and developed using a mask and a photolithography process to form a colored organic layer 430. After that, an underlying insulating material is etched using the colored organic layer 430 as an etching mask to form a passivation layer 190. Here, the colored organic layer 430 shields incident light from the thin film transistor. Otherwise, the colored organic layer can be formed on the gate wiring or the data wiring to shield leaky light around the wirings. In addition, the height of the colored organic layer 430 can be changed according to the conditions as in this embodiment.

Meantime, a transparent conductive material such as ITO or IZO is formed on the upper insulating layer 200 to form a common electrode 210.

According to the above-described embodiment, the nickel-suicide layer is formed as the data wiring. However, the nickel-silicide layer can be formed on all wirings including silicon such as a glass substrate, and especially on the gate wiring.

According to the present invention, since the thin film transistor substrate of the liquid crystal display device is manufactured by applying the nickel-silicide wiring, a device having low resistivity and good ohmic contact property can be obtained.

While the present invention is described in detail referring to the attached embodiments, various modifications, alternate constructions and equivalents may be employed without departing from the true spirit and scope of the present invention.

What is claimed is:

1. A thin film transistor substrate for a display device comprising:
   a gate line;
   a data line crossing the gate line and including:
      a nickel-silicide layer formed on an insulating layer including silicon, and
      a metal layer formed on the nickel-silicide layer; and
   a thin film transistor including:
      a gate electrode connected to the gate line;
      a source electrode that is connected to the data line and includes the nickel-silicide layer and the metal layer formed on the nickel-silicide layer; and
      a drain electrode including the nickel-silicide layer and the metal layer formed on the nickel-silicide layer,
   wherein a thickness of the nickel-silicide layer is in a range of about 10 Å to about 500 Å, and the metal layer comprises at least one selected from the group consisting of chromium (Cr), molybdenum (Mo), molybdenum (Mo—W), tantalum (Ta) and titanium (Ti).

2. The thin film transistor substrate as claimed in claim 1, wherein a sheet resistance of the nickel-silicide layer is about 50 Ω/cm or less.

3. The thin film transistor substrate as claimed in claim 1, wherein the gate line and the gate electrode include the nickel-silicide layer and the metal layer formed on the nickel-silicide layer.

4. The thin film transistor substrate as claimed in claim 1, wherein the nickel-silicide includes $NiSi_2$.

5. A thin film transistor substrate for a display device comprising:
   a gate line;
   a data line crossing the gate line and including:
      a nickel-silicide layer formed on an insulating layer including silicon, and
      a metal layer formed on the nickel-silicide layer; and
   a thin film transistor including:
      a gate electrode connected to the gate line;
      a source electrode that is connected to the data line and includes the nickel-silicide layer and the metal layer formed on the nickel-silicide layer; and
      a drain electrode including the nickel-silicide layer and the metal layer formed on the nickel-silicide layer,
   wherein a thickness of the nickel-silicide layer is in a range of about 10 Å to about 500 Å, and each of the gate line and the gate electrode include the nickel-silicide layer and the metal layer formed on the nickel-silicide layer.

6. A thin film transistor substrate for a display device comprising:
   a gate line;
   a data line crossing the gate line and including:
      a nickel-silicide layer formed on an insulating layer including silicon, and
      a metal layer formed on the nickel-silicide layer; and
   a thin film transistor including:
      a gate electrode connected to the gate line;
      a source electrode that is connected to the data line and includes the nickel-silicide layer and the metal layer formed on the nickel-silicide layer; and
      a drain electrode including the nickel-silicide layer and the metal layer formed on the nickel-silicide layer,
   wherein the metal layer comprises at least one selected from the group consisting of chromium (Cr), molybdenum (Mo), molybdenum (Mo—W), tantalum (Ta) and titanium (Ti), and each of the gate line and the gate electrode include the nickel-silicide layer and the metal layer formed on the nickel-silicide layer.

7. A method of manufacturing a thin film transistor substrate for a display device comprising:
   forming a gate wiring on a substrate;
   etching the gate wiring to form a gate pattern including a gate line, a gate pad and a gate electrode;
   forming a gate insulating layer including silicon;
   forming a semiconductor layer pattern and an ohmic contact layer pattern;
   depositing nickel as a first data wiring material on the ohmic contact layer pattern and depositing a second data wiring material on the first data wiring material;
   transforming nickel into nickel-silicide though a heat treating process;
   forming a photoresist pattern including a first portion, a second portion thicker than the first portion and a third portion thinner than the first portion;
   patterning the semiconductor layer, the ohmic contact layer, the first wiring material and second wiring material by using the photoresist pattern to form a data wiring including a data line crossing the gate line, a data pad connected to the data line, a source electrode adjacent to the gate electrode and connected to the data line and a drain electrode facing the source electrode with respect to the gate electrode;
   forming a passivation layer;
   patterning the gate insulating layer and the passivation layer to form contact holes for respectively exposing the gate pad, the data pad and the drain electrode;
   forming a transparent and conductive layer; and
   etching the transparent and conductive layer to form an auxiliary gate pad, an auxiliary data pad and a pixel electrode, respectively connected to the gate pad, the data pad and the drain electrode.

8. A thin film transistor substrate for a display device comprising:
   a gate line;
   a data line crossing the gate line and including:
      a nickel-silicide layer formed on an insulating layer including silicon, and
      a metal layer formed on the nickel-silicide layer;
   a thin film transistor including:
      a gate electrode connected to the gate line,
      a source electrode connected to the data line, and
      a drain electrode spaced apart from the source electrode; and
   a pixel electrode connected to the drain electrode and comprising a transparent and conductive material.

9. The thin film transistor substrate as claimed in claim 8, wherein a thickness of the nickel-silicide layer is in a range of about 10 Å to about 500 Å.

10. The Thin film transistor substrate as claimed in claim 8, wherein the metal layer comprises at least one selected from the group consisting of chromium (Cr), molybdenum (Mo), molybdenum (Mo—W), tantalum (Ta) and titanium (Ti).

11. The thin film transistor substrate as claimed in claim 8, wherein a sheet resistance of the nickel-silicide layer is about 50 Ω/cm or less.

12. The thin film transistor substrate as claimed in claim 8, wherein the gate line and the gate electrode include the nickel-silicide layer and the metal layer formed on the nickel-silicide layer 13. The thin film transistor substrate as claimed in claim 8, wherein the nickel-silicide includes $NiSi_2$.

14. The thin film transistor substrate as claimed in claim 9, wherein the metal layer comprises at least one selected from the group consisting of chromium (Cr), molybdenum (Mo), molybdenum (Mo—W), tantalum (Ta) and titanium (Ti).

* * * * *